United States Patent
Tanizaki et al.

[11] Patent Number: 6,064,621
[45] Date of Patent: May 16, 2000

[54] MULTI-BANK CLOCK SYNCHRONOUS TYPE SEMICONDUCTOR MEMORY DEVICE HAVING IMPROVED MEMORY ARRAY AND POWER SUPPLY ARRANGEMENT

[75] Inventors: Tetsushi Tanizaki; Mitsuya Kinoshita; Takeshi Fujino; Takahiro Tsuruda; Fukashi Morishita; Teruhiko Amano; Kazutami Arimoto; Mako Kobayashi, all of Hyogo, Japan

[73] Assignee: Mitsubishi Denki Kabushiki Kaisha, Tokyo, Japan

[21] Appl. No.: 09/113,147

[22] Filed: Jul. 10, 1998

[30] Foreign Application Priority Data

Jan. 13, 1998 [JP] Japan .................................. 10-004909

[51] Int. Cl.[7] ...................................................... G11C 8/00
[52] U.S. Cl. ........................ 365/230.03; 365/51; 365/63; 365/189.09; 365/226
[58] Field of Search ..................... 365/230.03, 51, 365/52, 63, 189.09, 226

[56] References Cited

U.S. PATENT DOCUMENTS 5,838,627  11/1998  Tomishima et al. .................. 365/51 X
5,862,096  1/1999  Yasuda et al. .................. 365/189.09 X
5,894,448  4/1999  Amano et al. .................. 365/230.03 X
5,943,285  8/1999  Kohno .................................. 365/230.03

FOREIGN PATENT DOCUMENTS 9-74171  3/1997  Japan .

*Primary Examiner*—Huan Hoang
*Attorney, Agent, or Firm*—McDermott, Will & Emery

[57] ABSTRACT

A rectangular semiconductor substrate region is divided into regions arranged in a plurality of rows and columns, and memory array blocks are provided to surround a central region. The plurality of memory array blocks are divided into a plurality of banks. Peripheral regions on both sides of the rectangular semiconductor substrate region are used as regions for providing sense amplifier power supply circuits, and circuits for generating a voltage to be transmitted onto word lines are provided at the four corner regions of the central region. Thus, a large storage capacity semiconductor memory device operating stably at a high speed and with reduced power consumption can be implemented.

19 Claims, 15 Drawing Sheets

FIG. 1
| ARRAY BLOCK PROVIDING REGION 1a | ARRAY BLOCK PROVIDING REGION 1d | ARRAY BLOCK PROVIDING REGION 1g |
|---|---|---|
| ARRAY BLOCK PROVIDING REGION 1b | CONTROL CKT FORMING REGION 1e | ARRAY BLOCK PROVIDING REGION 1h |
| ARRAY BLOCK PROVIDING REGION 1c | ARRAY BLOCK PROVIDING REGION 1f | ARRAY BLOCK PROVIDING REGION 1i |
FIG. 2
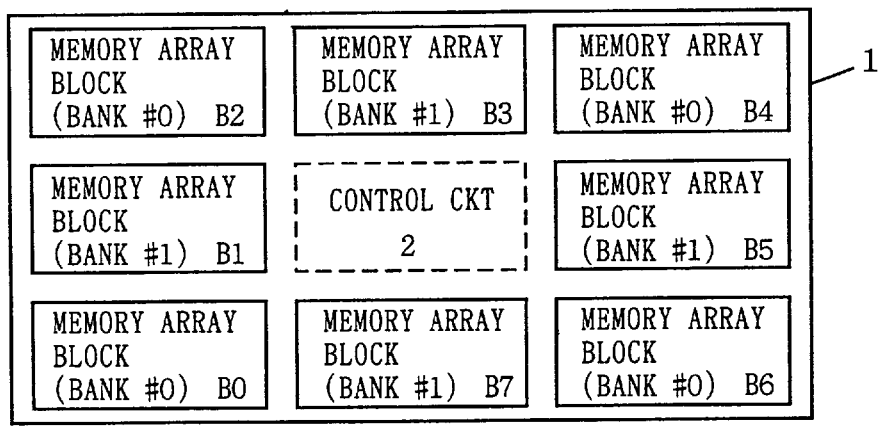
FIG. 3
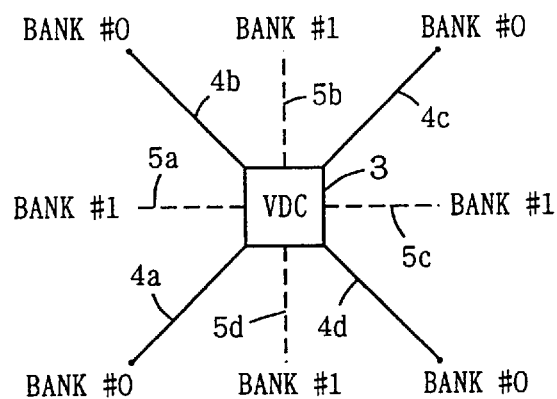

6,064,621

MULTI-BANK CLOCK SYNCHRONOUS TYPE SEMICONDUCTOR MEMORY DEVICE HAVING IMPROVED MEMORY ARRAY AND POWER SUPPLY ARRANGEMENT

BACKGROUND OF THE INVENTION

1. Field of the Invention

The present invention relates generally to semiconductor memory devices, and more particularly, to arrangements of arrays and power supply circuits for operating a large storage capacity semiconductor memory device stably and at a high speed. A particular object of the invention relates to arrangements of arrays and power supply circuits for operating a large storage capacity clock synchronous type Dynamic Random Access Memory stably and at a high speed, and more specifically, to arrangements of arrays and power supply circuits in a multi-bank clock synchronous type semiconductor memory device.

2. Description of the Background Art

In order to eliminate difference in operation speed between a microprocessor and a Dynamic Random Access Memory (DRAM) serving as a main memory for data transfer at a high speed for example, a clock synchronous type Dynamic Random Access Memory (SDRAM) which takes in an external signal and inputs/outputs data in synchronization with a clock signal such as a system clock is used.

FIG. 33 is a timing chart for use in illustration of the operation of a conventional SDRAM at the time of reading data. In the SDRAM, an operation mode is designated by a combination of the states of a plurality of external signals. The combination of the states of the plurality of external signals is referred to as "command". In FIG. 33, at a rising edge of a clock signal CLK in clock cycle #1, a row address strobe signal /RAS is set to an L level, and a column address strobe signal /CAS and a write enable signal /WE are maintained at an H level to provide an active command. Once the active command is provided, an address signal AD applied concurrently is used as a row address signal X to internally select a row, and the addressed row is driven into a selected state.

At a rising edge of clock signal CLK in clock cycle #3, row address strobe signal /RAS and write enable signal /WE are maintained at an H level, and column address strobe signal /CAS is set to an L level. The state is called "read command", and a data reading is specified. Once the read command is provided, address signal AD applied concurrently is used as a column address signal Y to internally select a column. In the SDRAM, valid data is output after the passage of a clock cycle or clock cycles called "CAS latency" from the application of the read command. In FIG. 33, the CAS latency is 2, and valid data Q0 is output at a rising edge of clock signal CLK in clock cycle #5.

Column address signals are generated in a prescribed sequence using column address signal Y as the head address, memory cells are sequentially selected and data is read out in synchronization with clock signal CLK. The number of pieces of data sequentially read out since one read command is provided is called "burst length".

In FIG. 33, data reading for a burst length of 4 is shown. Data of the burst length are read out, and then an output high impedance state is attained. In the memory cell array inside, however, the addressed row is maintained in a selected state.

Then, at a rising edge of clock signal CLK in clock cycle #9, row address strobe signal /RAS and write enable signal /WE are set to an L level, and column address strobe signal /CAS is set to an H level. The state is called "precharge command", and an array which has been selected is driven into a non-selected state. More specifically, the selected row is driven into a non-selected state, and the bit lines inside are all returned to a prescribed precharge voltage level.

FIG. 34 is a timing chart for use in illustration of the states of external signals at the time of writing data to the SDRAM. Similarly to the data reading as shown in FIG. 33, an active command is provided in clock cycle #1, and current address signal AD is used as row address signal X to select a row.

Then in clock cycle #3, row address strobe signal /RAS is set to an H level, and column address strobe signal /CAS and write enable signal /WE are set to an L level. The state is called "write command", and specifies a data writing. Address signal AD applied concurrently is used as column address signal Y to write data. At the time of writing data, write data D0 is applied simultaneously with the application of the write command, and external write data D1, D2 and D3 are sequentially taken inside at rising edges of clock signal CLK in clock cycles #4, #5 and #6, respectively. These pieces of write data D0 to D3 are written into selected memory cells in a prescribed sequence. Also at the time of writing data, column address signal Y is used as the head address to generate column address signals inside in a prescribed sequence to select memory cells are selected. Once the data writing completes, a precharge command is provided in clock cycle #9, and the array in a selected state is driven into a non-selected state.

As shown in FIGS. 33 and 34, an external signal is taken inside at a rising edge of clock signal CLK for determining its state, the timing of the external signal is determined relative to clock signal CLK, a timing margin for a skew in the external signal does not have to be taken into account, which makes earlier the internal operation start timing and permits high speed accessing. Data which is sampled at a rising edge of clock signal CLK can be input/output at the same frequency as that of clock signal CLK, which permits data transfer at a high speed.

FIG. 35 is a schematic diagram of an arrangement of array blocks and internal power supply circuits in a conventional SDRAM. In FIG. 35, the conventional SDRAM has memory array blocks MB#0 to MB#3 arranged in respective regions formed by dividing a rectangular semiconductor chip CH into four regions. Memory array blocks MB#0 to MB#3 each have a 16M-bit storage capacity, for example, and each include a row address decoder for selecting a row, a column address decoder for selecting a column and a sense amplifier for sensing and amplifying data in a selected memory cell.

In a central region CRa for the longer-side direction of semiconductor chip CH, there are provided a sense power supply circuit SVDC for supplying power supply voltage to the sense amplifiers, a peripheral power supply circuit PVDC for supplying power supply voltage to the peripheral circuitry, and an array boosting circuit WBC for generating a boosted voltage Vpp transmitted onto a selected word line (arranged corresponding to a row). Internal power supply circuits SVDC, PVDC and WBC are arranged in central region CRa, because an input/output circuit and a control circuit are provided in a central region CRb for the shorter-side direction of semiconductor chip CH. This is also because the lengths of supply lines for transmitting these internal power supply voltages to memory array blocks MB#0 to MB#3 should be equal.

Sense power supply circuit SVDC internally lowers externally supplied power supply voltage to a low voltage level, and the peripheral power supply circuit lowers externally supplied power supply voltage. The external power supply voltages are thus lowered inside for the following reasons. External logics or processors have not been reduced in size as much as DRAMs. In order to secure the breakdown voltage characteristics of components (MOS transistors) reduced in size in the DRAM, power supply voltage should be lowered depending upon the degree of down sizing (in order to secure the breakdown voltage of a gate insulating film in a MOS transistor). Meanwhile, if the power supply voltage is lowered for external processor or logics, the operation speed is lowered as well (because the MOS transistor is not reduced in size as much.) External power supply voltage such as system power supply voltage is lowered in the DRAM, in order to secure the breakdown voltage of the components and the operation characteristics of the external logics or processor.

Array boosting circuit WBC is used for the following reasons. Boosted voltage Vpp is transmitted onto a selected word line. In the SDRAM, similarly to a standard DRAM, a memory cell includes an access transistor of an n channel MOS transistor and a capacitor. Therefore, in order to prevent the threshold voltage loss across the access transistor and surely write data at a full power supply voltage level into the capacitor, boosted voltage Vpp higher than the power supply voltage is transmitted onto the selected word line.

FIG. 36 is a diagram of a configuration of the sense power supply circuit and peripheral power supply circuit shown in FIG. 35. In FIG. 36, sense power supply circuit SVDC and peripheral power supply circuit PVDC have a common structure, and therefore the power supply circuits are denoted by VDC.

Internal power supply circuit VDC includes a comparator CMP for comparing an internal power supply voltage Vin and a reference voltage Vref at a prescribed voltage level, and a drive transistor DR connected between an external power supply node EX and an internal power supply line to supply current to the internal power supply line from external power supply node EX based on the output signal of comparator CMP.

If internal power supply voltage Vin is higher than reference voltage Vref, the output signal of comparator CMP attains a high level, drive transistor DR is turned off, and the current supplying from external power supply node EX to the internal power supply line is stopped. Meanwhile, if internal power supply voltage Vin is lower than reference voltage Vref, the output signal of comparator CMP attains a low level, the conductance of drive transistor DR increases, and current is supplied from external power supply node EX to the internal power supply line to raise the voltage level of internal power supply voltage Vin. Therefore, internal power supply voltage Vin is maintained substantially at the voltage level of reference voltage Vref. By setting the voltage level of reference voltage Vref to an appropriate value, internal power supply voltage Vin at a desired voltage level is generated.

FIG. 37 is a diagram showing a configuration of array boosting circuit WBC shown in FIG. 35. In FIG. 37, array boosting circuit WBC includes a charge pump circuit WBCa for performing a charge pumping operation in response to a clock signal CLKp to generate boosted voltage Vpp. Charge pump circuit WBCa takes advantage of the charge pump operation of the capacitor.

Use of such power supply circuit VDC and boosting circuit WBC is encountered with the following problems.

As shown in FIG. 35, sense power supply circuit SVDC is provided in central region CRa between memory array blocks MB#0 to MB#3. If memory array blocks MB#0 to MB#3 form one bank, a memory cell selecting operation is performed in each of array blocks MB#0 to MB#3. If the memory cell selecting operation is performed at a time in memory array blocks MB#0 to MB#3, sense power supply circuit SVDC should supply current to the sense amplifiers included in memory array blocks MB#0 to MB#3. Drive transistor DR in sense power supply circuit SVDC therefore must have large driving capability, and its size (channel width) is set sufficiently large. Therefore, current is passed across drive transistor DR having a large size (channel width) during a sensing operation, DC current at the time of sensing operation (active DC current: an average of operation current at the time of sensing operation) cannot be reduced, which gives rise to increase in current consumption.

Sense power supply circuit SVDC provided in central region CRa is not provided at a position at a completely equal distance from memory array blocks MB#0 to MB#3. Therefore, the lengths of power supply lines from sense power supply circuit SVDC to memory array blocks MB#0 to MB#3 are different. If the lengths of the sense power supply lines are different, the impedances of the sense power supply lines are different, and therefore the amounts of reduction in the sense amplifier power supply voltage in the sense power supply lines are different. As a result, if the current supply capability of sense power supply circuit SVDC is determined in view of a power supply voltage drop in a power supply line with small impedance (a voltage drop caused by current flowing at the time of sensing operation), a large voltage drop is caused in a sense power supply line with larger impedance, which makes difficult accurate sensing operation. If the current driving capability of sense power supply circuit SVDC is determined in view of a voltage drop in a sense amplifier power supply line with large impedance, unnecessary current is supplied to a sense power supply line with small impedance, in other words, unnecessary current is consumed. Therefore, the imbalance of the impedances of the sense amplifier power supply lines reduces the margin for the sense amplifier power supply voltage, and stable operation cannot be secured.

If the size (channel width) of drive transistor DR in sensing power supply circuit SVDC is increased, large current is passed across drive transistor DR at the time of sensing operation, to compensate for a drop in internal power supply voltage (sense amplifier power supply voltage) Vin. In this case, the large current causes ringing in internal power supply voltage Vin, internal power supply voltage Vin fluctuates and it takes a long period of time for the voltage to reach a stable level, so that the sensing operation can not be stably performed (because data in a memory cell is maintained at the sense amplifier power supply voltage level). In this case, it takes a long period of time for data in a memory cell read out onto each bit line to be stabilized, in other words, high speed accessing can not be achieved.

This is also true to peripheral power supply circuit PVDC.

Array boosting circuit WBC generates boosted voltage Vpp transmitted onto a selected word line. In this case, the lengths of boosted voltage transmission lines for memory array blocks MB#0 to MB#3 are different, the voltage levels of boosted voltage Vpp transmitted onto a selected word line in memory array blocks MB#0 to MB#3 are different, so that accurate writing of memory cell data cannot be secured. If the driving capability of array boosting circuit WBC is sufficiently made large, the voltage level of boosted voltage Vpp could be raised more than necessary. In this case, the breakdown voltage characteristics of gate insulating films in MOS transistors which are reduced in size cannot be sufficiently secured. If the driving capability of array boosting circuit WBC is considerably reduced in order to prevent the voltage level of boosted voltage Vpp from being raised, in sequentially selecting word lines at a high speed, a next word line could be selected before the voltage level of boosted voltage Vpp fully returns to the original voltage level, word line driving voltage at a desired voltage level cannot be transmitted onto a selected word line, high speed reading operation cannot be performed, and sensing timing must be delayed (because the conductance of the access transistor cannot be sufficiently larger by boosted voltage Vpp and charge transfer to a corresponding bit line from the capacitor cannot be performed at a high speed).

Memory array blocks MB#0 to MB#3 in the SDRAM shown in FIG. 35 each include a column decoder, a row decoder and a sense amplifier circuit. In the SDRAM, an operation mode is designated in the form of command, and a memory cell addressed in response to an address signal applied at the time of the application of the command is accessed. If, therefore, a bank address signal is applied simultaneously with the command, memory array blocks MB#0 to MB#3 can be operated as a bank (only a memory array block addressed by a bank address is operated.) Hence, by operating each bank in an interleaved manner, data can be serially accessed by switching between the banks at the time of switching between pages.

In the bank arrangement, however, the banks are driven into a selected state and a non-selected state (an array active state and an array non-active state) independently from each other. Sense power supply circuit SVDC therefore must continually operate to supply current to the sense amplifiers when the banks are driven in the interleaved manner, and the same is true with the peripheral circuit as well as array boosting circuit WBC. The same problem as the previously described single bank arrangement is therefore encountered in the case of this bank arrangement. This is particularly serious if the memory capacity is increased, for example, to 128M bits or 1G bit, and the number of memory cells included in memory array blocks MB#0 to MB#3 increases, because difference between the line impedances becomes significant.

FIG. 38 is a diagram of another power supply circuit arrangement of a conventional SDRAM. In the SDRAM shown in FIG. 38, sense power supply circuits SVDCa and SVDCb are provided in the outer peripheral region of a central region CRb of a semiconductor chip CH for its shorter-side direction. Sense power supply circuit CVDCa supplies power supply voltage to sense amplifier circuits included in memory array blocks MB#0 and MB#1. Sense power supply circuit SVDCb supplies power supply voltage to sense amplifier circuits included in memory array blocks MB#2 and MB#3.

A peripheral power supply circuit PVDC which supplies power supply voltage to the peripheral circuits and an array boosting circuit WBC which generates boosted voltage Vpp transmitted onto a selected word line are arranged in a central region CRa of semiconductor chip CH for its longer-side direction, similarly to the arrangement shown in FIG. 35.

In the arrangement of the power supply circuits shown in FIG. 38, two sense power supply circuits SVDCa and SVDCb are provided in order to stably supply current at the time of sensing operation when the largest amount of current is consumed. Here, sense power supply circuits SVDCa and SVDCb consume current substantially half that of the one sense power supply circuit arrangement. The size (channel width) of drive transistors included in sense power supply circuits SVDCa and SVDCb can be reduced and the current supplying capability can be reduced, while bit line charging current can be supplied stably at the time of sensing operation.

If the storage capacity of memory array blocks MB#0 to MB#3 increases, the number of memory cells increases accordingly, which increases the number of columns of memory cells. The maximum number of memory cells connected to one row is determined by the word line capacitance, and the number of memory cells connected to one column is determined based on the capacitance ratio of bit line capacitance and memory cell capacitor. If the memory capacity increases, the numbers of rows and columns increase as well. Therefore, the number of sense amplifiers increases, which accordingly increases sense current (bit line charging current) to be supplied by sense power supply circuits SVDCa and SVDCb, which makes it difficult to stably supply sense amplifying power supply voltage without causing oscillation (ringing) for such a large storage capacity memory.

Peripheral power supply circuit SVDC and array boosting circuit WBC are each commonly provided to memory array blocks MB#0 to MB#3 similarly to the arrangement shown in FIG. 35, and therefore the same problem caused by the arrangement shown in FIG. 35 is encountered.

Japanese Patent Laying-Open No. 9-74171, for example, discloses an arrangement of reducing signal propagation delay by providing memory array blocks in the periphery of a control circuit, setting equal the lengths of signal lines from the control circuit to the memory array blocks, for the purpose of operating the device at a high speed without increasing signal propagation delay from the control circuit in a mass storage memory. The prior art, however, simply takes into account the relation between the arrangement of the control circuit and the memory array blocks, and does not suggest anything about how to divide the memory array blocks into banks in the bank arrangement and how to arrange power supply circuits in the single bank arrangement and multi-bank arrangement.

SUMMARY OF THE INVENTION

It is an object of the invention to provide a semiconductor memory device capable of operating stably and at a high speed.

Another object of the invention is to provide a semiconductor memory device including an array arrangement which implements stable and high speed operation.

Yet another object of the invention is to provide a semiconductor memory device including an internal power supply circuit arrangement which implements stable and high speed operation.

A still further object of the invention is to provide a multi-bank semiconductor memory device including an array and internal power supply circuit arrangement which implements a mass storage capacity without losing stable and high speed operation characteristics.

A semiconductor memory device according to a first aspect of the invention includes a plurality of memory blocks provided surrounding a central region in the center of a rectangular semiconductor substrate region and separated from each other, and each including a plurality of memory cells arranged in a matrix of rows and columns, a plurality of array power supply circuits provided in a peripheral region positioned at an outer portion of the plurality of memory blocks at both ends of the rectangular semiconductor substrate region in a first direction for generating voltage to be transmitted onto memory cells in the plurality of memory blocks, and a control circuit provided in the central region for controlling accessing to the plurality of memory blocks.

In the semiconductor memory device according to this first aspect, the plurality of banks include memory blocks provided point-symmetrically about the central region.

In the semiconductor memory device according to this first aspect, the plurality of banks includes memory blocks provided adjacent to each other.

A semiconductor memory device according to a second aspect of the invention includes a plurality of memory blocks provided to surround the central region of a rectangular semiconductor substrate region and each having a plurality of memory cells, and a control circuit provided in the central region for controlling accessing to the plurality of memory blocks. The plurality of memory blocks are divided into a plurality of banks which are driven into an active state and a non-active state independently from each other under the control of the control circuit. The plurality of banks each include memory blocks arranged point-symmetrically about the central region.

A semiconductor memory device according to a third aspect of the invention includes a plurality of memory blocks provided to surround a central region of a rectangular semiconductor substrate region and each having a plurality of memory cells, and a control circuit provided in the central region for controlling accessing to the plurality of memory blocks. The plurality of memory blocks are divided into a plurality of banks which are driven into an active state and a non-active state independently from each other under the control of the control circuit. The plurality of banks each include memory blocks arranged adjacent to each other.

By providing the memory blocks to surround the control circuit in the central region, distance from the control circuit to each memory block is set equal, which eliminates difference in signal propagation delay, in other words, a margin for the signal propagation delay does not have to be considered, and high speed operation is enabled.

The peripheral region of the substrate region is an empty region, therefore array power supply circuits can be provided with a sufficient margin, and array power supply voltage can be stably provided to each memory block. In addition, by providing an array power supply circuit corresponding to a prescribed number of memory blocks at the peripheral region, array power supply voltage can be stably supplied to these memory blocks.

Furthermore, by providing a row driving power supply circuit in the central region, row driving voltage can be transmitted to each memory block through the same line distance, therefore it is not necessary to take into account a margin for voltage drop by the lines, and stable operation can be secured. Such row driving power supply circuit can be provided corresponding to a prescribed number of memory blocks, thus row driving voltage can be stably transmitted to each memory block, and high speed operation can be implemented (because it is not necessary to take into account a margin for a drop in the row driving voltage).

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic diagram of a substrate region of a semiconductor memory device according to the present invention;

FIG. 2 is a schematic diagram of the arrangement of memory array blocks in a semiconductor memory device according to a first embodiment of the invention;

FIG. 3 is a schematic diagram of the arrangement of power supply lines in the arrangement of memory array blocks shown in FIG. 2;

DESCRIPTION OF THE PREFERRED EMBODIMENTS

First Embodiment

Figure 4:
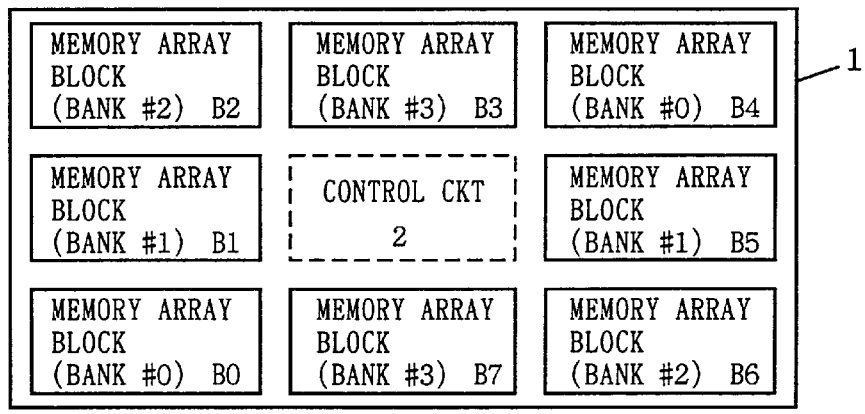
FIG. 4 is a schematic diagram of the arrangement of a variation of the first embodiment of the invention.

FIG. 1 is a schematic diagram of the layout of a semiconductor memory device on a chip according to a first embodiment of the invention. In FIG. 1, a semiconductor substrate region 1 in which the semiconductor memory device is formed is divided into a 3 row×3 column matrix of sub-regions 1a to 1i. Semiconductor substrate region 1 is for example a single semiconductor chip having a rectangular shape. Among subregions 1a to 1i provided in the 3 row×3 column matrix, sub-region 1e provided in the center is allocated to a region to form a control circuit. The other subregions 1a to 1d and 1f to 1i surrounding subregion 1e to form the control circuit are formed as regions for providing memory array blocks.

Semiconductor substrate region 1 is divided into small regions in a multi-row×multi-column matrix (3 rows×3 columns), therefore a region having substantially the same area as that of a memory array block providing region can be acquired as the region to form the control circuit, and therefore, the control circuit can be provided with a sufficient margin. By providing the memory array blocks to surround the control circuit, the line distance from the control circuit to each array block can be minimized, and signal propagation delay can be reduced. Similarly, by providing an internal power supply circuit in subregion 1e in the center, power supply voltage can be supplied through the minimum line length to each memory array block, and the effect of voltage drop by the impedance of the supply lines can be sufficiently restricted.

Bank Arrangement 1

FIG. 2 is a schematic diagram of the arrangement of arrays in the semiconductor memory device according to the first embodiment of the invention. In FIG. 2, a control circuit 2 is provided in the region in the center of semiconductor substrate region 1, and memory array blocks B0 to B7 are provided to surround control circuit 2.

Control circuit 2 is formed in region 1e to form the control circuit in FIG. 1, and memory array blocks B0 to B7 are provided corresponding to array block providing regions 1a to 1d and 1f to 1i shown in FIG. 1.

The semiconductor memory device shown in FIG. 2 has a multi-bank arrangement, in which memory array blocks B0, B2, B4 and B6 form a bank #0, and memory array blocks B1, B3, B5 and B7 form a bank #1. Banks #0 and #1 include memory blocks provided point-symmetrically about control circuit 2. Control circuit 2 controls activation/inactivation of memory array blocks B0 to B7, and controls data accessing. Herein, the activation/inactivation refers to the state in which a word line is driven into a selected/non-selected state in a memory array block. Memory array blocks B0 to B7 each include a plurality of memory cells provided in a matrix of rows and columns.

The banks are driven into an active/inactive state independently from each other. If, therefore, one bank is activated/inactivated, the memory array blocks point-symmetrically provided to control circuit 2 operate and consume current. Therefore, the regions consuming current are provided distributed in a well-balanced manner on semiconductor substrate region 1, which brings about the following advantages.

Now, let us consider the layout in which an internal power supply circuit (internal down converting circuit (VDC)) 3 is provided in control circuit forming region 1e to form the control circuit in the center as shown in FIG. 3. Internal power supply circuit 3 supplies power supply commonly to memory array blocks B0 to B7. Power supply lines 4a, 4b, 4c and 4d are arranged from internal power supply circuit 3 to memory array blocks provided point-symmetrically with respect to internal power supply circuit 3. Power supply lines 4a to 4d transmit power supply voltage to the memory array blocks included in bank #0. Meanwhile, power supply lines 5a to 5d similarly supply power supply voltage to the memory array blocks provided point-symmetrically to internal power supply circuit 3 and opposite in the horizontal and vertical directions in FIG. 3 with respect to the central circuit. More specifically, power supply lines 5a to 5d supply power supply voltage to the memory array blocks included in bank #1. At the time of the operation of bank #0, current on power supply lines 4a to 4d is consumed. The memory array blocks included in bank #0 are positioned at substantially equal distances from internal power supply circuit 3. Therefore the impedances of power supply lines 4a to 4d can be set substantially the same, in other words the effects of the impedances are the same, the fluctuations of power supply voltage are the same, and the memory array blocks can be operated under the same voltage condition at the time of the operation of bank #0, which implements stable operation.

At the time of the operation of bank #1, current is consumed through power supply lines 5a to 5d. Power supply lines 5a to 5d have substantially the same line length, the impedances thereof are equal, and the memory array blocks included in bank #1 can be operated under the same power supply voltage condition, which implements stable operation. These power supply lines 4a to 4d and 5a to 5d supply power supply voltage to the memory array blocks arranged to surround the center region, power supply voltage can be supplied through the minimum line length. For signal lines, the lengths of lines to the memory blocks in one bank are the same, which reduces the effect of time delay and voltage drop.

Variation

FIG. 4 is a diagram of a variation of the array layout of the semiconductor memory device according to the first embodiment. In FIG. 4, memory array blocks B0 to B7 are provided to surround control circuit 2 provided in the central region on semiconductor substrate region 1. This is the same as the arrangement shown in FIG. 2. In the arrangement shown in FIG. 4, however, while memory array blocks provided point-symmetrically to control circuit 2 similarly form the same bank, memory array blocks B0 to B7 are divided into four banks. More specifically, memory array blocks B0 and B4 form bank #0, memory array blocks B1 and B5 form bank #1, memory array blocks B2 and B6 form bank #2, and memory array blocks B3 and B7 form bank #3.

Figure 5:
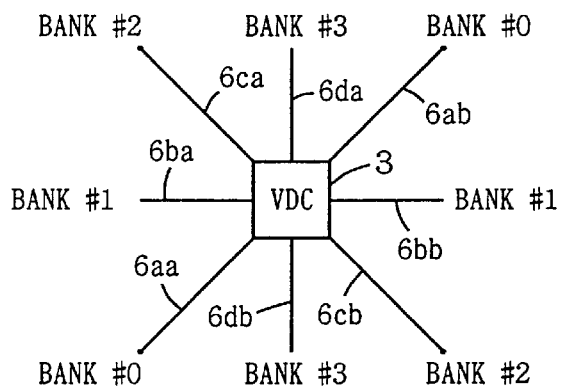
FIG. 5 is a diagram of the arrangement of power supplies in the arrangement of memory array blocks shown in FIG. 4.

In the bank arrangement shown in FIG. 4, two memory blocks arranged point-symmetrically to control circuit 2 form one bank. More specifically, at the time of the activation/inactivation of one bank, the two memory array blacks operate simultaneously. Here, the arrangement of power supply shown in FIG. 5 is considered. More specifically, an internal power supply circuit 3 is provided in a control circuit forming region 2, and power supply voltage is supplied to each memory array block. Here, the memory array blocks included in bank #0 are provided with power supply voltage from power supply lines 6aa and 6ab, the memory array blocks included in bank #1 are provided with power supply voltage from power supply lines 6ba and 6bb, the memory array blocks included in bank #2 are provided with power supply voltage from power supply lines 6ca and 6cb, and the memory array blocks included in bank #3 are provided with power supply voltage from power supply lines 6da and 6db.

These power supply lines 6aa to 6db are provided radially from internal power supply circuit 3, and power supply lines having substantially the same length can be provided to memory array blocks included in one bank (memory array blocks positioned point-symmetrically to the internal power supply circuit form one bank.) Therefore, the impedances of the power supply lines to the memory array blocks included in the bank can be substantially equal at the time of the operation of the bank, the memory array blocks can be operated under the same voltage conditions (such as voltage drop by current consumption). Even if the power supply voltage is lowered, the memory blocks of the common bank can be operated stably with the same margin for the lowered power supply voltage. Propagation delay and voltage drop on the signal lines are the same for the memory blocks in the same one bank.

As in the foregoing, according to the first embodiment of the invention, memory array blocks are arranged to surround a control circuit, memory array blocks positioned point-symmetrically with respect to control circuit 2 form one bank, and therefore the portions consuming current in the semiconductor substrate region can be distributed in a well balanced manner, and an internal power supply circuit can be readily provided such that the impedances of the power supply lines can be set the same for the memory array blocks included in a common bank. Thus, a multi-bank semiconductor memory device capable of stably operating with an improved power supply voltage margin can be implemented.

Second Embodiment

Figure 6:
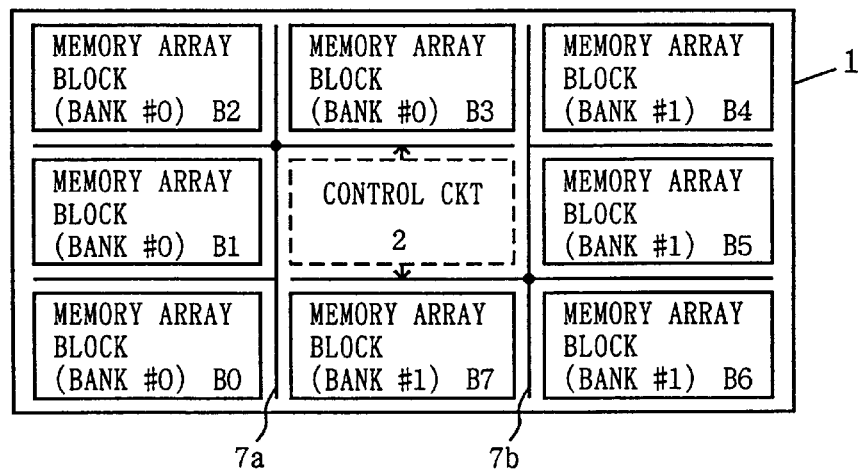
FIG. 6 is a schematic diagram of the arrangement of memory array blocks in a semiconductor memory device according to a second embodiment of the invention.

FIG. 6 is a diagram showing the arrangement of banks in a semiconductor memory device according a second embodiment of the invention. In FIG. 6, similarly to the first embodiment, memory array blocks B0 to B7 are provided to surround a control circuit 2 positioned in a central region of semiconductor substrate region 1. These memory array blocks B0 to B7 are divided into two banks #0 and #1 including adjacent memory array blocks. More specifically, memory array blocks B0 to B3 form bank #0, and memory array blocks B4 to B7 form bank #1. As shown in FIG. 6, if one bank is formed by adjacent memory array blocks, the following advantages are brought about.

More specifically, a bus 7a for transmitting voltage and signals (control and address signals) from control circuit 2 is provided for memory array blocks B0 to B3 included in bank #0 and a bus 7b for similarly transmitting voltage and signals from control circuit 2 is provided for memory array blocks B4 to B7 included in bank #1. Memory array blocks B0 to B7 operate on a bank-basis. Memory array blocks in a bank are collectively provided. Therefore, control for adjusting the current supplying capability of the internal power supply circuit and for generating a control signal depending upon the operation circumstance can be made collectively to a single region, which makes the control easier.

Buses 7a and 7b for transmitting control signals and voltage (such as power supply voltage and driving voltage) can be symmetrically arranged for banks #0 and #1, respectively, and these buses 7a and 7b are not complicated, which makes easier interconnection layout, and voltage/signals can be transmitted through the minimum line length.

Variation

Figure 7:
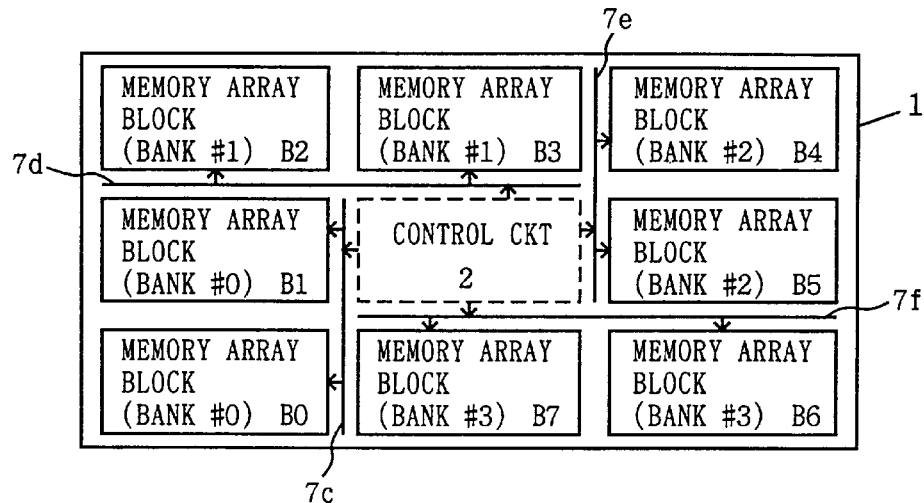
FIG. 7 is a schematic diagram of the arrangement of a variation of the second embodiment of the invention.

FIG. 7 is a diagram showing a variation of the semiconductor memory device according to the second embodiment of the invention. In FIG. 7, memory array blocks B0 to B7 provided to surround control circuit 2 disposed in the central region are divided into four memory banks #0 to #3. Bank #0 includes memory array blocks B0 and B1, bank #1 includes memory array blocks B2 and B3, bank #2 includes memory array blocks B4 and B5 and bank #3 includes memory array blocks B6 and B7.

Also in the 4-bank arrangement, one bank is formed of adjacent memory array blocks. Therefore, buses 7c to 7f for transmitting voltage and signals can be provided corresponding to banks #0 to #3, respectively, which makes interconnection layout easier.

As described above, according to the second embodiment of the invention, adjacent memory array blocks among a plurality of memory array blocks provided to surround a central region form a bank, the control of supplying power supply voltage and the operation of memory arrays (the operation of selecting/non-selecting a memory cell) can be performed collectively for each region, which makes the control easier, and signal lines and voltage transmission lines can be more easily laid out.

Third Embodiment

Figure 8:
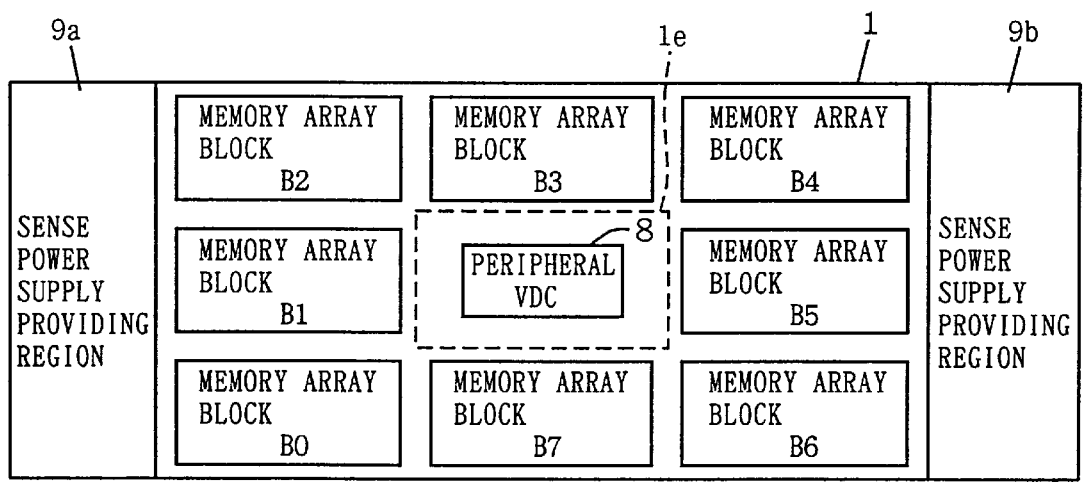
FIG. 8 is a schematic diagram of the arrangement of internal power supply circuits in a semiconductor memory device according to a third embodiment of the invention.

FIG. 8 is a schematic diagram showing the arrangement of arrays and a power supply circuit in a semiconductor memory device according to a third embodiment of the invention. In FIG. 8, the semiconductor memory device includes memory array blocks B0 to B7 provided to surround a central region 1e. There is provided in central region 1e a peripheral power supply circuit (peripheral VDC) 8 for supplying power supply voltage to the peripheral circuitry of the semiconductor memory device. In both end regions in the longer side direction (a first direction) of semiconductor substrate region 1, sense power supply providing regions 9a and 9b for providing power supply circuits for sense amplifiers are formed. These sense power supply providing regions 9a and 9b are formed extending along the shorter-side direction of semiconductor substrate 1. As a result, a relatively large region can be used for a power supply circuit (VDC) for a sense amplifier, and therefore a power supply circuit which stably supplies power supply voltage to the sense amplifier can be implemented.

Sense amplifier power supply voltage supplied from the sense amplifier power supply circuits provided in sense power supply providing regions 9a and 9b are supplied in various forms to memory array blocks B0 to B7. More specifically, the sense amplifier power supply circuit provided in sense power supply providing region 9a may supply sense amplifier power supply voltage to memory array blocks B0 to B3, while the sense amplifier power supply circuit provided in sense power supply providing region 9b may supply sense amplifier power supply voltage to memory array blocks B4 to B7. Sense amplifier power supply lines from sense power supply providing regions 9a and 9b can be provided extending over semiconductor substrate region 1 to supply the sense amplifier power supply voltage commonly to memory array blocks B0 to B7. In the single-bank arrangement in which memory array blocks B0 to B7 form a single bank, power supply voltage to the sense amplifiers can be stably supplied even if memory array blocks B0 to B7 operate at a time.

Peripheral power supply circuit 8 is disposed in central region 1e positioned at equal distances from memory array blocks B0 to B7. As a result, power supply voltage can be stably supplied to the peripheral circuitry of memory array blocks B0 to B7 without the influence of the impedances of the power supply lines, and the power supply voltage margin can be increased, which leads to stable operation.

Figure 9:
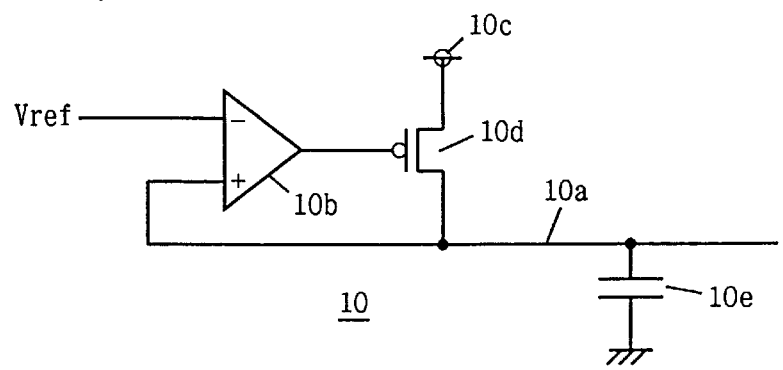
FIG. 9 is a diagram of an example of the arrangement of sense amplifier power supply circuits provided in the sense power supply arrangement region shown in FIG. 8.

FIG. 9 is a diagram showing an example of a sense amplifier power supply circuit. In FIG. 9, sense amplifier power supply circuit 10 includes a comparator 10b for comparing voltage on a sense amplifier power supply line 10a and reference voltage Vref, and a drive transistor 10d formed of a p channel MOS transistor connected between an external power supply node 10c for receiving externally applied power supply voltage and sense amplifier power supply line 10a to receive an output signal from comparator 10b at its gate. A decoupling capacitance or stabilizing capacitance 10e for stabilizing the voltage on sense amplifier power supply line 10a is connected to the region between sense amplifier power supply line 10a and a ground node.

The sense amplifier power supply circuit shown in FIG. 9 generates sense amplifier power supply voltage at a reference voltage Vref level by lowering the power supply voltage applied to external power supply node 10c. Relatively large current is passed in sense amplifier power supply line 10a at the time of the operation of the sense amplifiers. At the time, decoupling capacitance 10e compensates for the consumed current, and restricts the abrupt deviation of the sense amplifier power supply voltage. Thus, erroneous operations caused by power supply noises generated by large peak current at the time of the operation of the sense amplifiers can be prevented.

Decoupling capacitance 10e should have a relatively large capacitance value (if the capacitance value is small, it may operate as a coupling capacitance to cause power supply noises.) Sense amplifier power supply circuit 10e is however provided for each of sense amplifier supply providing regions 9a and 9b as shown in FIG. 8. Sense power supply providing regions 9a and 9b extend along the shorter side direction of semiconductor substrate region 1. Therefore, the regions have areas large enough to form decoupling capacitance 10e which requires a large area with a sufficient margin, and therefore sense amplifier power supply circuit 10 which stably generates sense amplifier power supply voltage can be implemented. Sense amplifier power supply circuit 10 is provided in each of sense power supply providing regions 9a and 9b.

Figure 10:
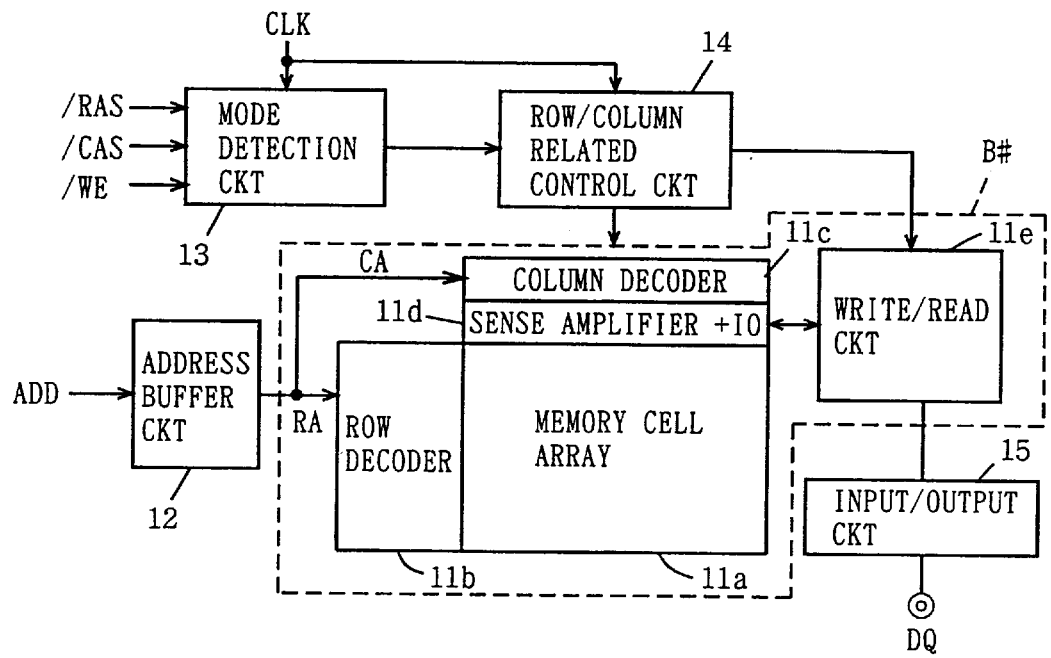
FIG. 10 is a schematic diagram showing the configuration of the memory array blocks and the control circuit shown in FIG. 8.

FIG. 10 is a schematic diagram of one memory array block and a control circuit. The memory block shown in FIG. 10 corresponds to a memory array block shown in FIG. 8, and the semiconductor memory device is in a single-bank arrangement.

Memory array block B# (B0 to B7) includes a memory cell array 11a having a plurality of memory cells arranged in a matrix of rows and columns, a row decoder 11b for decoding an applied row address signal RA to drive an addressed row in memory cell array 11a into a selected state, a column decoder 11c for decoding an applied column address signal CA to select an addressed column in memory cell array 11a, a sense amplifier provided corresponding to each column in memory cell array 11a for sensing, amplifying and latching memory cell data on a corresponding column, and a column selecting gate (IO gate) for selecting a corresponding column according to a column selecting signal from column decoder 11a. In FIG. 10, the sense amplifier and the IO gate are indicated by a single block 11d.

Memory block B# further includes a writing/reading circuit 11e for writing/reading data to/from a selected memory cell in memory cell array 11a. Writing/reading circuit 11e includes a writing drive circuit for writing data to a selected memory cell and a preamplifier for reading out data from a selected memory cell.

In order to control accessing to memory block B#, there are provided an address buffer circuit 12 for generating internal address signals RA and CA from an externally applied address signal ADD, a mode detection circuit 13 which receives externally applied control signals, in other words a row address strobe signal /RAS, a column address strobe signal /CAS and a write enable signal /WE, determines the logical states of these signals at a rising edge of a clock signal CLK and detects a specified operation mode, a row/column related control circuit 14 for controlling a row/column selecting operation to memory block B# according to a mode specifying signal from mode detection circuit 13, and an input/output circuit 15 for inputting/outputting data between the outside of the memory device and memory array block B#.

Address buffer circuit 12 takes in and latches applied address signal ADD and generates an internal row address signal RA when mode detection circuit 13 detects a specification of a column selecting operation. If mode detection circuit 13 detects a data writing/reading mode, address buffer circuit 12 takes in and latches applied address signal ADD and generates an internal column address signal CA.

Row/column related control circuit 14 activates row decoder 11b and the sense amplifier in a prescribed sequence when a detection signal from mode detection circuit 13 specifies a column selecting mode. If mode detection circuit 13 detects the data writing/reading mode, row/column control circuit 14 activates column decoder 11c, writing/reading circuit 11e and input/output circuit 15 in a prescribed sequence. If mode detection circuit 13 specifies a transition of memory block B# into a non-selected state, in other words specifies a precharging, row/column related control circuit 14 inactivates row decoder 11b and the sense amplifier, and precharges each bit line in memory cell array 11a.

Power supply voltage from sense amplifier power supply circuits 10 provided in sense power supply providing regions 9a and 9b is applied to the sense amplifiers. Peripheral power supply circuit (peripheral VDC) 8 applies one operation power supply voltage to the peripheral circuits in memory block B#, in other words to row decoder 11b, column decoder 11c, and writing/reading circuit 11e therein. Address buffer circuit 12, mode detection circuit 13, row/column related control circuit 14 and input/output circuit 15 are disposed in the central region shown in FIG. 8, and operation power supply voltage can be applied from peripheral power supply circuit 8 to these circuits.

Figure 11A:
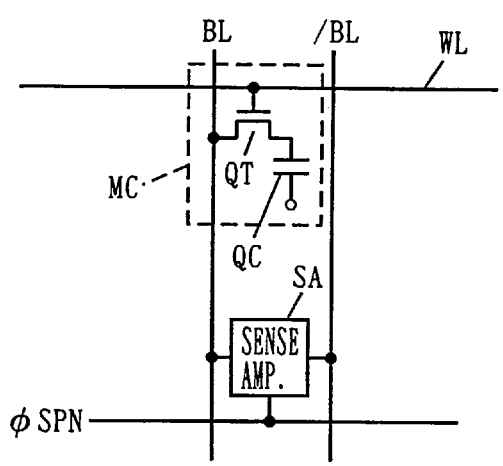
FIG. 11A is a schematic diagram showing the memory cell array and the sense amplifier shown in FIG. 10.

FIG. 11A is a schematic diagram of the memory cell array portion in FIG. 10. In memory cell array 11a, a word line is provided corresponding to each row of memory cells, and a bit line pair is provided corresponding to each column of memory cells. In FIG. 11, one word line WL and a pair of bit lines BL and /BL are generically shown. A memory cell MC is provided corresponding to the crossing of word line WL and bit line pair BL and /BL. Memory cell MC includes a capacitor QC for storing information, and an access transistor QT of an n channel MOS transistor which responds to a signal potential on word line WL to connect capacitor QC to bit line BL. A memory cell MC is provided corresponding to the crossing portion of word line WL and one of bit line BL and /BL.

At the time of selecting a memory cell, charge stored in memory cell capacitor QC is transmitted onto a corresponding bit line BL (or /BL). The other bit line /BL (or BL) is held at a prescribed precharge voltage level. A sense amplifier SA is provided corresponding to a bit line pair. Sense amplifier SA is activated in response to an activation of a sense amplifier activation signal φSPN, differentially amplifies and latches the potentials of bit lines BL and /BL.

Figure 11B:
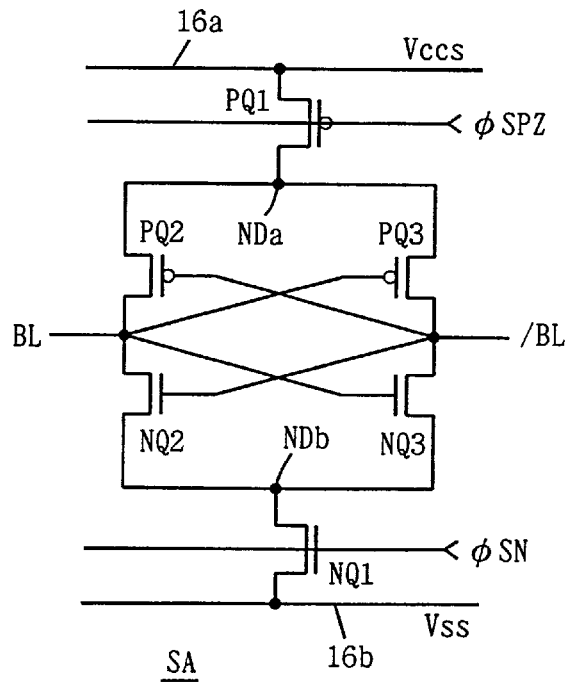
FIG. 11B is a diagram of an example of the sense amplifier as shown in FIG. 11A.

FIG. 11B shows an example of sense amplifier SA. In FIG. 11B, sense amplifier SA includes a p channel MOS transistor PQ1 connected between a sense amplifier power supply line 16a and a node NDa and responding to an activation of a P sense amplifier activation signal φSPZ to conduct, a p channel MOS transistor PQ2 connected between node NDa and bit line BL and having its gate connected to bit line /BL, a p channel MOS transistor NQ3 connected between node NDa and bit line /BL and having its gate connected to bit line BL, an n channel MOS transistor NQ1 connected between a sense amplifier ground line 16b and a node NDb and receiving an N sense amplifier activation signal φSN at its gate, an n channel MOS transistor NQ2 connected between node NDb and bit line BL and having its gate connected to bit line /BL, and an n channel MOS transistor NQ3 connected between node NDb and bit line /BL and having its gate connected to bit line BL. P sense amplifier activation signal φSPZ is set to an L level when activated, and N sense amplifier activation signal φSN is driven into an H level when activated.

In a stand-by state, sense amplifier activation signals φSPZ and φSN are in an inactive state, and MOS transistors PQ1 and NQ1 are in an off state. In this state, nodes NDa and NDb are held at an intermediate voltage level by the function of a precharging/equalizing circuit which is not shown, and held at the same voltage level as bit lines BL and /BL. As a result, MOS transistors PQ2, PQ3, NQ2 and NQ3 are all brought into an off state.

When a memory cell is selected, and a potential difference corresponding to data read out from the memory cell is generated on bit lines BL and /BL, N sense amplifier activation signal φSN is activated, which turns on MOS transistor NQ1, and node NDb is electrically connected to sense amplifier ground line 16b. If the potential of bit line BL is higher than that of bit line /BL, the conductance of MOS transistor NQ3 is larger than that of MOS transistor NQ2, and bit line /BL is discharged to a ground voltage level. If bit line /BL is discharged to the ground voltage level, MOS transistor NQ2 maintains a completely off state.

Subsequently, P sense amplifier activation signal φSPZ is activated to turn on MOS transistor PQ1. Assuming now that bit line /BL is at an L level as at ground voltage Vss level, the conductance of MOS transistor PQ2 is larger than that of MOS transistor PQ3 (bit line BL is at the intermediate voltage level almost at the level of precharging voltage), therefore bit line BL is charged through MOS transistors PQ1 and PQ2, and the voltage level of bit line BL is raised to the level of voltage Vcc on sense amplifier power supply line 16a. When bit line BL reaches the voltage level of sense power supply voltage Vccs, and bit line /BL attains ground voltage Vss level, MOS transistors PQ2, PQ3, NQ2 and NQ3 are turned off, and sense amplifier SA is in a latch state, and almost no current is consumed.

As shown in FIG. 11B, sense amplifier SA supplies current to a high potential bit line from sense amplifier power supply line 16a, and a low potential bit line is discharged to sense amplifier ground line 16b. Sense amplifier SA is provided corresponding to each bit line pair BL and /BL. As a result, at the time of sensing operation, sensing current for charging/discharging a bit line is passed. Voltage to sense amplifier power supply line 16a is provided from sense power supply providing regions 9a and 9b as shown in FIG. 8, current passed at the time of the sensing operation can be stably compensated for with a sufficient margin, and accurate sensing operation can be performed.

Note that for sense amplifier SA in FIG. 11B, sense amplifier power supply voltage Vccs and ground voltage Vss are provided to sense amplifier power supply lines 16a and 16b, respectively. Voltage at a voltage level slightly higher than ground voltage Vss can be transmitted to sense amplifier ground line 16b.

Sense amplifier power supply line 16a and sense amplifier ground line 16b can be precharged to the intermediate voltage level in a stand-by state, and can be driven to power supply voltage Vccs and ground voltage Vss, respectively when activated.

Variation 1

Figure 12:
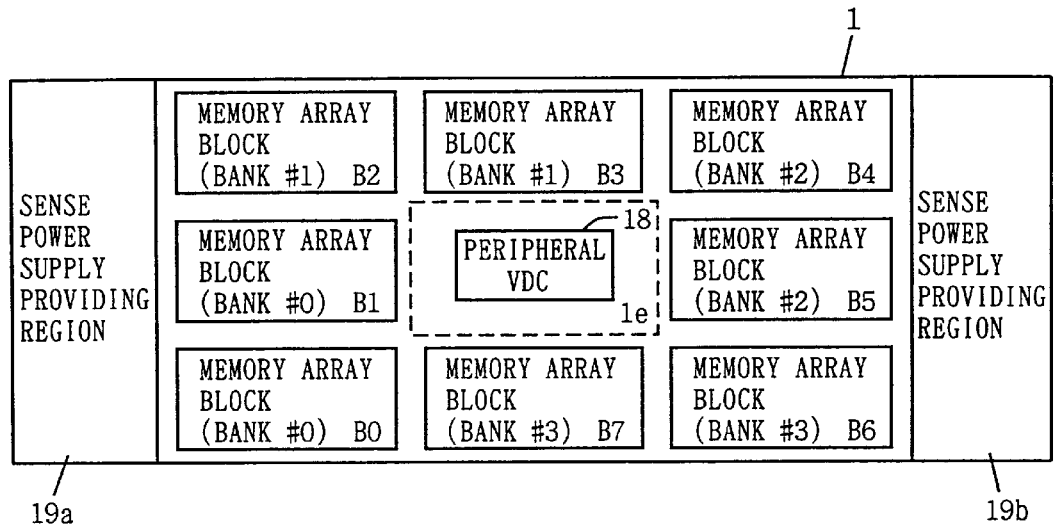
FIG. 12 is a schematic diagram of the arrangement of a variation 1 of the third embodiment of the invention.

FIG. 12 is a schematic diagram of a variation 1 of the semiconductor memory device according to the third embodiment of the invention. In FIG. 12, memory array blocks B0 to B7 provided to surround a central region 1e are divided into banks #0 to #3. Bank #0 includes memory array blocks B0 and B1 adjacent to each other, bank #1 includes memory array blocks B2 and B3 adjacent to each other, bank #2 includes memory blocks B4 and B5, and bank #3 includes memory array blocks B6 and B7.

In the peripheral regions provided on semiconductor substrate region 1 in the longer side direction, sense power supply circuits 19a and 19b are provided, respectively. Sense power supply circuit 19a supplies sense amplifier power supply voltage to memory array block B0 to B3 included in banks #0 and #1, and sense power supply circuit 19b supplies power supply voltage to sense amplifiers in memory array blocks B4 to B7 included in banks #2 and #3.

A peripheral power supply circuit (peripheral VDC) 18 disposed in central region 1e supplies power supply voltage to peripheral circuits included in memory array blocks B0 to B7.

In the 4-bank arrangement, even if memory banks #0 to #3 are driven independently from each other, sense amplifier power supply voltage can be stably supplied, because one sense power supply circuit is provided for each four memory array blocks.

Figure 13:
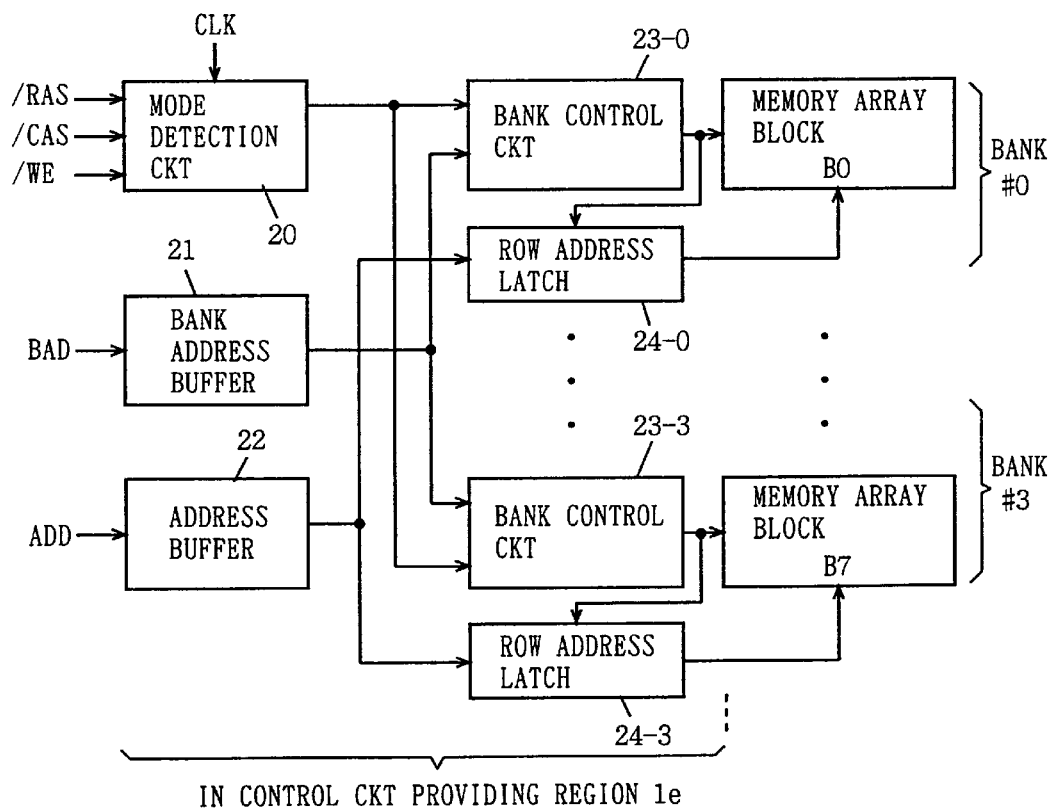
FIG. 13 is a schematic diagram of the configuration of the control circuit in the semiconductor memory device shown in FIG. 12.

FIG. 13 is a schematic diagram of the configuration of the control circuit in the semiconductor memory device in FIG. 12. In FIG. 13, memory array blocks B0 to B7 are divided into banks #0 to #3. Banks #0 to #3 each include adjacent two memory array blocks.

The control circuit includes a mode detection circuit 20 which determines the combination of the logic states of applied signals /RAS, /CAS and /WE at a rising edge of clock signal CLK and outputs an operation instruction signal based on the result of determination, a bank address buffer 21 which receives an externally applied bank address signal BAD, and an address buffer 22 which receives an externally applied address signal ADD. Bank address buffer 21 and address buffer 22 take in externally applied address signals BAD and ADD respectively in synchronization with a rising edge of clock signal CLK.

The control circuit further includes bank control circuits 23-0 to 23-3 provided corresponding to banks #0 to #3 and receiving a mode instruction signal from mode detection circuit 20 and a bank address signal from bank address buffer 21, and row address latches 24-0 to 24-3 for latching/resetting a row address signal from address buffer 22 according to instruction signals from corresponding bank control circuit 23-0 to 23-3. Bank control circuits 23-0 to 23-3 each are activated when a bank address signal from bank address buffer 21 specifies a corresponding bank, and output a control signal for operating in an operation mode specified according to the operation mode specifying signal from mode detection circuit 20.

Bank control circuits 23-0 to 23-3 are equivalent to row/column related control circuit 14 shown in FIG. 10 and operate according to the bank address signal. The column address signal from address buffer 22 is commonly applied to memory array blocks B0 to B7 (the path of which is not shown). The column address signal is generated when a data access command, in other words, a read command or a write command is provided. In this case, accessing to data in the bank specified by the bank address signal is performed. Column address signals are sequentially generated inside using to a burst address counter which is not shown.

Mode detection circuit 20, bank address buffer 21, address buffer 22, bank control circuits 23-0 to 23-3 and row address latches 24-0 to 24-3 are provided in central region 1e shown in FIG. 12. Power supply voltage from peripheral power supply circuit 18 is provided to the control circuit formed in central region 1e. Power supply voltage from peripheral power supply circuit 18 is also applied to the peripheral circuits included in memory array blocks B0 to B7 (the configuration of memory array blocks B0 to B7 is the same as that shown in FIG. 10.) Power supply voltage to the sense amplifiers included in memory array blocks B0 to B7 is applied from sense power supply circuits 19a and 19b shown in FIG. 12. Therefore, as described above, peripheral power supply circuit 18 is provided at substantially equal distances from memory array blocks B0 to B7, the influence of the impedances of the power supply lines is substantially the same to these memory array blocks B0 to B7, each bank can be operated at the same timing, the fluctuation of the power supply voltage of memory array blocks in each bank is the same, and therefore stable operation can be achieved without considering a margin for the fluctuation of the power supply voltage.

Note that, in the arrangement shown in FIG. 12, memory array blocks B0 to B7 are divided into four banks #0 to #3. However, memory array blocks B0 to B7 can be divided into two banks #0 and #1. Sense amplifier power supply voltage from one of sense power supply circuits 19a and 19b is supplied to one bank, and sense amplifier power supply voltage from the other sense power supply circuit is supplied to the other bank. The same effect can be brought about in this case.

As in the foregoing, according to the third embodiment of the invention, since power supply circuit for peripheral circuitry are provided in a central region, distances between surrounding memory array blocks and the peripheral power supply circuit are substantially the same, the influence of the power supply line impedances can be equal to each memory array block, and therefore power supply voltage can be stably supplied for high speed operation.

In addition, since power supply circuits for sense amplifier are provided at the periphery of the semiconductor substrate region, sense amplifier power supply circuits can be provided using a relatively large area, the number of memory array blocks supplied with voltage by one sense amplifier power supply circuit is reduced, and therefore sense amplifier power supply voltage can be stably supplied, which secures accurate sensing operation.

Fourth Embodiment

Figure 14:
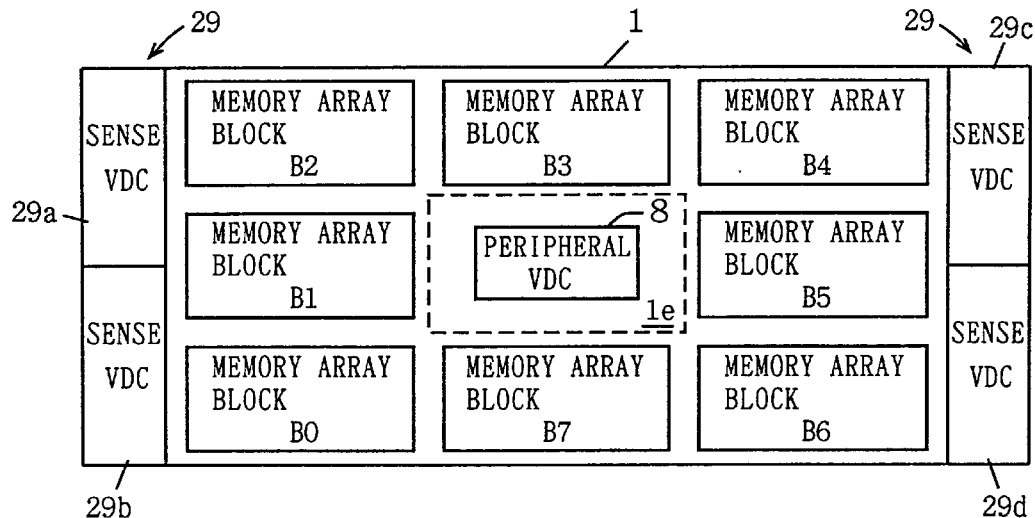
FIG. 14 is a schematic diagram showing a semiconductor memory device according to a fourth embodiment of the invention.

FIG. 14 is a schematic diagram of the arrangement of memory array blocks and a power supply circuit in a semiconductor memory device according to a fourth embodiment of the invention. In FIG. 14, in each of sense amplifier power supply providing regions 29 at both ends of semiconductor substrate region 1, two sense amplifier power supply circuits (sense VDC) are provided. More specifically, in one sense amplifier power supply providing region, sense amplifier power supply circuits 29a and 29b are provided, and in the other sense amplifier power supply providing region, sense amplifier power supply circuits 29c and 29d are provided.

Memory array blocks B0 to B7 are provided to surround central region 1e, form a single bank, and receive power supply voltage from peripheral power supply circuit 8 provided in central region 1e. In the semiconductor memory device in the single-bank arrangement shown in FIG. 14, by providing two sense amplifier power supply circuits in both end regions of semiconductor substrate region 1, the following advantages are provided.

In a dynamic type semiconductor memory device, storage information should be periodically refreshed in order to hold the storage information. For the refreshing, a plurality of kinds of refresh cycles are prepared in view of current consumption. For example, there are 4K refresh cycle device which requires 4K times of refreshing to refresh all the memory cells, and 8K refresh cycle device which requires 8K times of refreshing to refresh all the memory cells. The 4K refresh cycle device and 8K refresh cycle device have the same internal structure. The address allocation is switched by the connection of bonding pads or mask interconnection. In the 4K refresh device, the number of word lines selected in a single refresh cycle is twice that of the 8K refresh cycle device.

At the time of refreshing operation, data in a memory cell connected to a selected word line should be sensed and amplified by a sense amplifier for restoring. As a result, the number of sense amplifiers to operate in the 4K refresh cycle device is twice that of the 8K device. Current consumption at the time of the sensing operation is twice as much accordingly. As a result, in the arrangement shown in FIG. 14, sense amplifier power supply circuits 29a and 29d are optimized depending upon current consumption at the time of the sensing/amplification operation in the 8K refresh device. In the 4K refresh device, these sense amplifier power supply circuits 29a to 29d are all utilized. Meanwhile, in the 8K refresh cycle device, one of sense amplifier power supply circuits 29a and 29b, and one of sense amplifier power supply circuits 29a and 29d are used.

Sense amplifier power supply circuits 29a and 29b supply sense amplifier power supply voltage to memory array blocks B0 to B3, and sense amplifier power supply circuits 29c and 29d supply sense amplifier power supply voltage to memory array block B4 to B7. As a result, in the 8K refresh cycle device, each memory array block is supplied with sense amplifier power supply voltage from one sense amplifier power supply circuit, and in the 4K refresh cycle device, each memory array block is supplied with sense amplifier power supply voltage from two sense amplifier power supply circuits. Therefore, in any of the 8K refresh cycle device and 4K refresh cycle device, sense amplifier power supply voltage can be stably supplied, current more than necessary will not be supplied, and therefore current consumption can be reduced.

Note that, in the above description, in any of the 4K refresh cycle device and 8K refresh cycle device, the number of word lines to be selected in a normal operation mode are the same as that in a refresh cycle. If the number of word lines to be selected in a refresh cycle is greater than the number of word lines to be selected in the normal operation mode, in the 4K refresh cycle device, one sense amplifier power supply circuit can be selectively activated in the normal operation while operating two sense amplifier power supply circuits in the refresh cycle.

The number of sense amplifier power supply circuits depending on the number of refresh cycles is set using bonding pads or mask interconnections.

Variation

Figure 15:
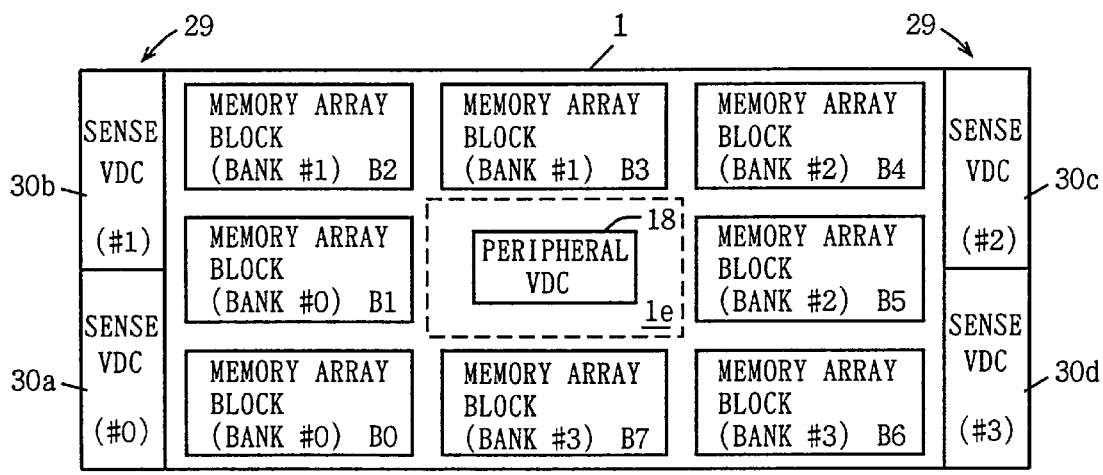
FIG. 15 is a schematic diagram of a variation 1 of the semiconductor memory device according to the fourth embodiment of the invention.

FIG. 15 is a diagram showing a variation of the fourth embodiment of the invention. In FIG. 15, in the semiconductor memory device, memory array blocks B0 to B7 provided to surround a central region 1e are divided into four banks #0 to #3. Banks #0 to #3 each include memory array blocks adjacent to each other. More specifically, bank #0 includes memory array blocks B0 and B1, bank #1 includes memory array blocks B2 and B3, bank #2 includes memory array blocks B4 and B5, and bank #3 includes memory array blocks B6 and B7. Peripheral power supply circuit 18 to supply power supply voltage to the peripheral circuits of memory array blocks B0 to B7 is provided in central region 1e.

At both end regions 29 in the longer side direction of semiconductor substrate region 1, a sense amplifier power supply circuit (sense VDC) is provided to each bank. More specifically, in one sense power supply providing region 29, sense amplifier power supply circuits 30a and 30b for banks #0 and #1 respectively are provided, and in the other sense amplifier power supply providing region 29, sense amplifier power supply circuits 30c and 30d for banks #2 and #3 respectively are provided.

In the arrangement shown in FIG. 15, sense amplifier power supply circuits 30a and 30d supply sense amplifier power supply voltage only to their corresponding banks, and therefore sense amplifier power supply lines are separated for each bank (in the arrangement shown in FIG. 14, the sense amplifier power supply lines are shared between the two sense amplifier power supply circuits.)

Figure 16:
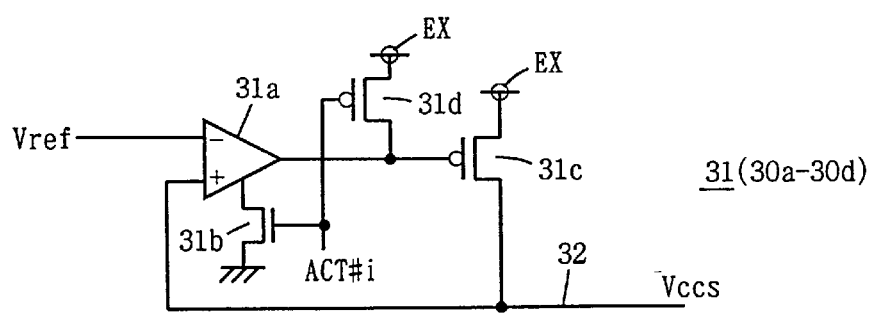
FIG. 16 is a diagram of an example of the sense amplifier power supply circuit as shown in FIG. 15.

FIG. 16 is a diagram showing an example of the arrangement of sense amplifier power supply circuits 30a to 30d shown in FIG. 15. In FIG. 16, sense amplifier power supply circuits 31 (30a to 30d) includes a comparator 31a for comparing sense amplifier power supply voltage Vccs on sense amplifier power supply line 32 and reference voltage Vref when activated, an n channel MOS transistor 31b for activating comparator 31a in response to an activation of a bank activation signal ACT#i, a drive transistor 31 of a p channel MOS transistor connected between an external power supply node EX and sense amplifier power supply line 32 to supply current to sense amplifier power supply line 32 from external power supply node EX according to an output signal from comparator 31a, and a p channel MOS transistor 31d which conducts when bank activation signal ACT#i is inactivated, and pulls up the gate voltage of drive transistor 31c to an external power supply voltage level.

Bank activation signal ACT#i is activated when bank i (i=0 to 3) is specified and an active command to instruct an activation of an array (where a word line is driven into a selected state and a sense amplifier performs a sensing operation) is provided. As a result, sense amplifier power supply circuit 31 is activated only in a bank provided with the active command and instructed of an activation of the array, and the power supply voltage level on sense amplifier power supply line 32 is stably held.

When a precharge command is provided and an inactivation of an array is instructed, bank activation signal ACT#i is inactivated, MOS transistor 31b is turned off, and the comparing operation of comparator 31a is stopped. MOS transistor 31d conducts and raises the gate potential of drive transistor 31c to the external power supply voltage level to drive MOS transistor 31c into a non-conductive state.

In the sense amplifier power supply circuit shown in FIG. 16, drive transistor 31c is held in a non-conductive state when the bank is inactivated. In order for sense amplifier power supply voltage Vccs on sense amplifier power supply line 32 to be stably held at a prescribed voltage level, a down convert circuit continuously operating with small current driving capability can be used as well.

According to the configuration shown in FIGS. 15 and 16, when a bank is activated, only a sense amplifier power supply circuit provided corresponding to the activated bank is activated. Sense amplifier power supply circuits 30a to 30d are optimized to stably supply sense amplifier power supply voltage when their corresponding banks are activated. Therefore, sense amplifier power supply circuits 30a to 30d do not need current driving capability more than necessary, and the semiconductor memory device can stably supply sense amplifier power supply voltage to an activated bank by sufficient current supplying capability as required, unnecessary current consumption can be prevented, in other words, current consumption can be reduced.

Furthermore, by providing sense amplifier power supply circuits 30a to 30d to bank #0 to #3, respectively, a sense amplifier power supply circuit can be optimized for each bank, and does not need current driving capability more than necessary, and therefore stable sense amplifier power supply voltage without ringing can be produced.

A sense amplifier power supply circuit can be provided adjacent to each bank, interconnections can be laid out to minimize the impedances of sense amplifier power supply lines, and therefore sense amplifier power supply voltage does not drop so much, so that stable sense amplifier power supply voltage at a desired voltage level can be supplied.

In the arrangement shown in FIG. 15, memory array blocks B0 to B7 are divided to four banks #0 to #3. However, if memory array blacks B0 to B7 are divided into two banks #0 and #1, two sense amplifier power supply circuits can be operated at a time using a bank address signal, the two sense amplifier power supply circuits operate at a time also in the two-bank arrangement where four memory array blocks are activated at a time, and therefore sense amplifier power supply voltage can be similarly stably supplied. As a result, by providing a sense amplifier power supply circuit for each bank in the 4-bank arrangement, sense amplifier power supply voltage can be stably supplied even if the bank arrangement is switched to the two-bank arrangement.

As in the foregoing, according to the fourth embodiment of the invention, since sense amplifier power supply circuits are provided corresponding to banks, a sense amplifier power supply circuit can be optimized for each bank, and therefore sense amplifier power supply voltage can be stably supplied. In addition, a sense amplifier power supply circuit can be provided in the vicinity of each bank, the impedance of a sense amplifier power supply line can be minimized, and therefore sense amplifier power supply voltage at a desired voltage level can be supplied without considering dropping of sense amplifier power supply voltage, so that stable sensing operation can be secured.

Fifth Embodiment

Figure 17:
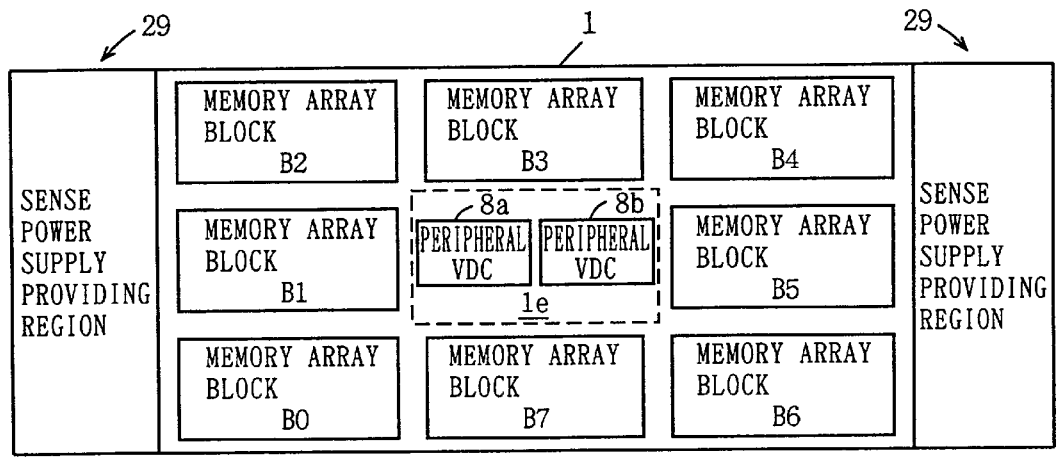
FIG. 17 is a schematic diagram of a semiconductor memory device according to a fifth embodiment of the invention.

FIG. 17 is a schematic diagram of the power supply arrangement of a semiconductor memory device according to a fifth embodiment of the invention. In FIG. 17, two peripheral power supply circuits 8a and 8b are provided in a central region 1e in semiconductor substrate region 1. Memory array blocks B0 to B7 are provided to surround central region 1e. Memory array blocks B0 to B7 form one bank (single-bank arrangement). Peripheral power supply circuit 8a supplies power supply voltage to the peripheral circuits of memory array blocks B0 to B3, and peripheral power supply circuit 8b supplies power supply voltage to the peripheral circuits of memory array blocks B4 to B7.

In a sense power supply providing region 29 provided at a peripheral region of semiconductor substrate region 1, a sense amplifier power supply circuit is provided. In each of sense power supply providing regions 29, as is the case with the fourth embodiment, one or more sense amplifier power supply circuits are provided.

As shown in FIG. 17, by providing peripheral power supply circuits 8a and 8b, the number of memory array blocks supplied with power supply voltage by each of peripheral power supply circuits 8a and 8b is 4, and therefore the size (channel width) of the drive transistor included in peripheral power supply circuits 8a and 8b can be reduced. As a result, at the time of the operation of the peripheral circuits, ringing which could be caused when power supply voltage is held with large current driving capability can be restricted, and therefore power supply voltage for the peripheral circuits can be stably supplied.

Variation 1

Figure 18:
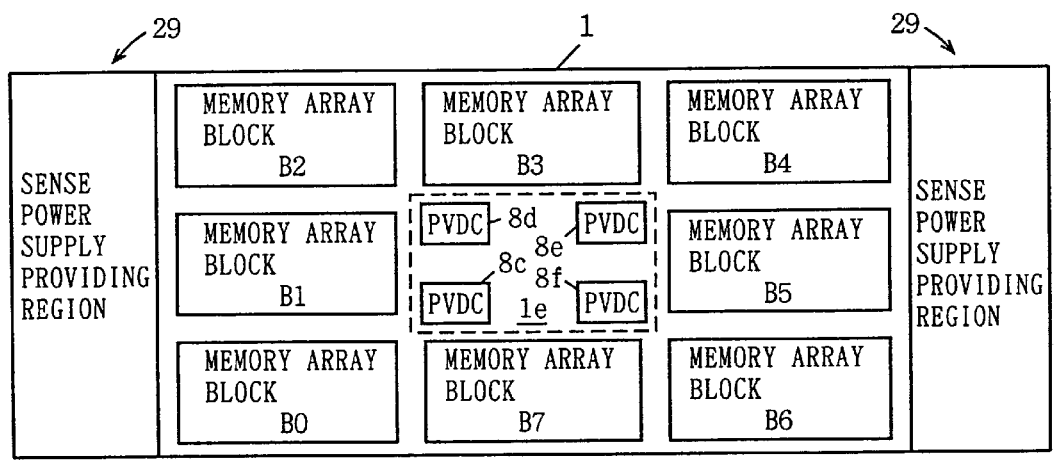
FIGS. 18 to 20 are schematic diagrams showing variations 1 and 2 of the fifth embodiment of the invention.

FIG. 18 is a schematic diagram of a variation 1 of the fifth embodiment of the invention. In the arrangement shown in FIG. 18, peripheral power supply circuits (PVDC) 8c to 8f are provided at the four corner regions of central region 1e. Peripheral power supply circuit 8c supplies power supply voltage to the peripheral circuits of memory array blocks B0 and B1, and peripheral power supply circuit 8d supplies power supply voltage to the peripheral circuits included in memory array blocks B2 and B3. Peripheral power supply circuit 8e supplies power supply voltage to the peripheral circuits included in memory array blocks B4 and B5. Peripheral power supply circuit 8f supplies power supply voltage to the peripheral circuits included in memory array blocks B6 and B7. The other configuration is the same as that shown in FIG. 17.

In the configuration shown in FIG. 18, peripheral power supply circuits 8c to 8f each need only supply power supply voltage to the peripheral circuits included in the two memory array blocks. As a result, the current supplying capability of peripheral power supply circuits 8c to 8f can be reduced, and ringing in peripheral power supply voltage can be restricted accordingly. Peripheral power supply circuits 8c to 8f can be provided in the vicinity of their corresponding memory array blocks, the length of power supply line can be reduced, interconnections can be laid out to minimize the impedance of the power supply lines, and therefore the peripheral circuits can be stably operated.

Variation 2

Figure 19:
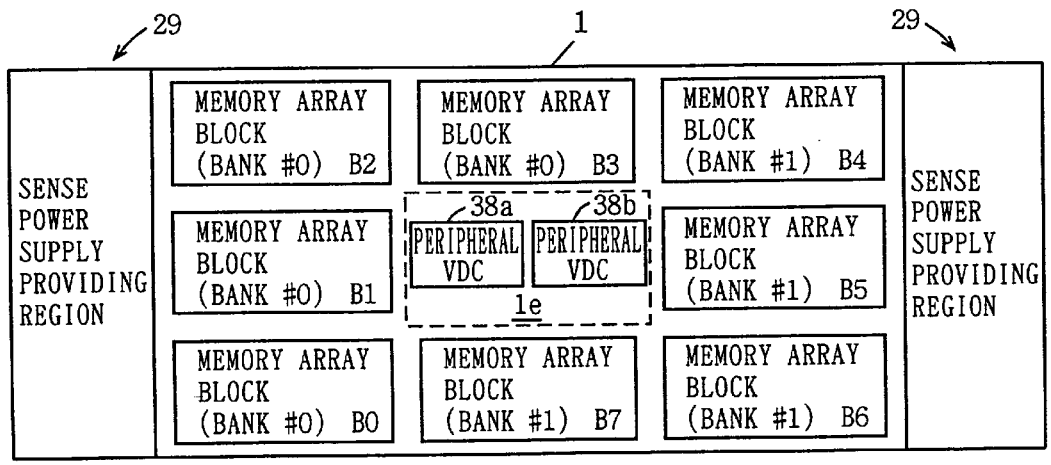

FIG. 19 is a diagram showing a variation 2 of the fifth embodiment of the invention. In FIG. 19, memory array blocks B0 to B7 provided to surround central region 1e are divided into banks #0 and #1. Bank #0 includes memory array blocks B0 to B3, and bank #1 includes memory array blocks B4 to B7.

In central region 1e, peripheral power supply circuits (peripheral VDC) 38a and 38b are provided corresponding to banks #0 and #1. Peripheral power supply circuit 38a supplies power supply voltage to the peripheral circuits of memory array blocks B0 to B3 in bank #0, and peripheral power supply circuit 38b supplies power supply voltage to the peripheral circuits included in memory array blocks B4 to B7 in bank #1. In sense power supply providing region 29 in the peripheral region on both sides of semiconductor substrate region 1 in the longer-side direction, a sense amplifier power supply circuit is appropriately provided according to the fourth embodiment.

In the arrangement shown in FIG. 19, by providing peripheral power supply circuits 38a and 38b corresponding to banks #0 and #1, the current driving capability of peripheral power supply circuits 38a and 38b can be reduced, and ringing in power supply voltage for the peripheral circuits can be prevented accordingly. Since a peripheral power supply circuit is provided for each of banks #0 and #1, power supply voltage for the peripheral circuit is supplied from a corresponding peripheral power supply circuit only to a selected bank, and since the current driving capability of the operating peripheral power supply circuit is small, d.c. current (active DC current) passed at the time of the operation can be reduced, which reduces current consumption accordingly.

The number of sense amplifier power supply circuits provided in each of sense power supply providing region 29 can be one or more.

Variation 3

Figure 20:
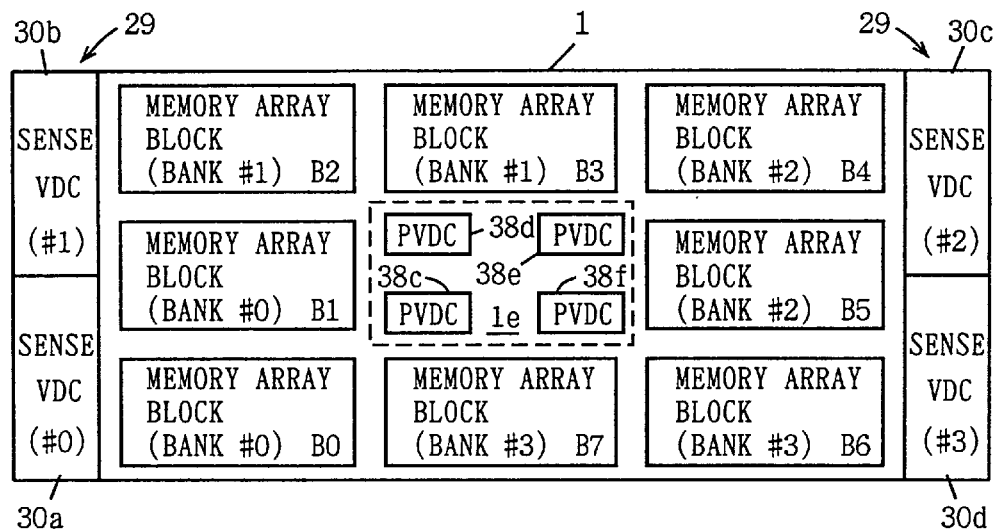

FIG. 20 is a diagram showing a variation 3 of the fifth embodiment of the invention. In FIG. 20, memory array blocks B0 to B7 provided to surround a central region 1e are divided into four banks #0 to #3. Banks #0 to #3 each include adjacent two memory array blocks.

At the four corners of central region 1e, peripheral power supply circuits (PVDC) 38c to 38f are provided corresponding to banks #0 to #3. Peripheral power supply circuit 38c supplies power supply voltage to the peripheral circuits of memory array blocks B0 and B1 in bank #0, and peripheral power supply circuits 38d supplies power supply voltage to the peripheral circuits of memory array blocks B2 and B3 in bank #1.

In sense power supply providing region 29 provided at the peripheral region on both sides of semiconductor substrate region in the longer-side direction, sense amplifier power supply circuits (sense VDC) 30a to 30d are provided corresponding to banks #0 to #3. Sense amplifier power supply circuit 30a supplies power supply voltage to sense amplifiers in bank #0, sense amplifier power supply circuit 30b supplies power supply voltage to sense amplifiers included in bank #1, sense amplifier power supply circuit 30c supplies power supply voltage to sense amplifiers included in bank #2, and sense amplifier power supply circuit 30d supplies power supply voltage to sense amplifiers included in bank #3.

A peripheral power supply circuit for generating power supply voltage to a peripheral circuit is provided corresponding to each of banks #0 to #3, the size (channel width) of a drive transistor for supplying current included in each of peripheral power supply circuits 38c to 38f can be reduced, the power supply voltage of the peripheral circuits do not have to be maintained with large current supplying capability when the peripheral circuit of a corresponding bank is operated, and therefore ringing in the power supply voltage caused by overdrive can be restricted, so that the peripheral circuits can be stably operated.

Banks #0 to #3 are driven into a selected/nonselected state (array activation/non-activation state) independently from each other. Even if relatively large current is passed at the time of charging/discharging a signal line when the peripheral circuit is operated, the current driving capability of each peripheral power supply circuit is small, so that the active DC current providing an average of the operation current values can be reduced, which leads to reduction in current consumption.

Furthermore, by providing sense amplifier power supply circuits 30a to 30d corresponding to banks #0 to #3, the same effect as the fourth embodiment can be brought about. By providing sense amplifier power supply circuits 30a to 30d and peripheral circuits 38c to 38f corresponding to banks #0 to #3, the number of sense amplifier power supply circuits and peripheral power supply circuits increases as a function of the number of memory array blocks included in a bank. When the 4-bank arrangement semiconductor memory device is used as the two-bank arrangement semiconductor device, an optimized peripheral power supply circuit and an optimized sense power supply circuit can be implemented by switching the 4-bank arrangement to the 2-bank arrangement. Thus, current consumption more than necessary can be prevented, and a semiconductor memory device operating stably with a reduced current consumption is implemented.

As in the foregoing, according to the fifth embodiment, since a plurality of peripheral circuit power supply circuits are provided in a central region, the current driving capability of a peripheral power supply circuit can be reduced, ringing in the power supply voltage for the peripheral circuit can be restricted, and therefore the peripheral circuit can be stably operated.

Furthermore, by providing a peripheral power supply circuit corresponding to each bank, the current driving capability of the peripheral power supply circuit can be reduced, which reduces the active DC current at the time of operation, and therefore current consumption can be reduced. By providing peripheral power supply circuits at the four corners of the central region, interconnection layout can be implemented such that the line length between corresponding memory array blocks and peripheral power supply circuits is minimized, and that peripheral circuit power supply voltage at a desired voltage level can be generated stably without the influence of the power supply line impedance.

Sixth Embodiment

Figure 21:
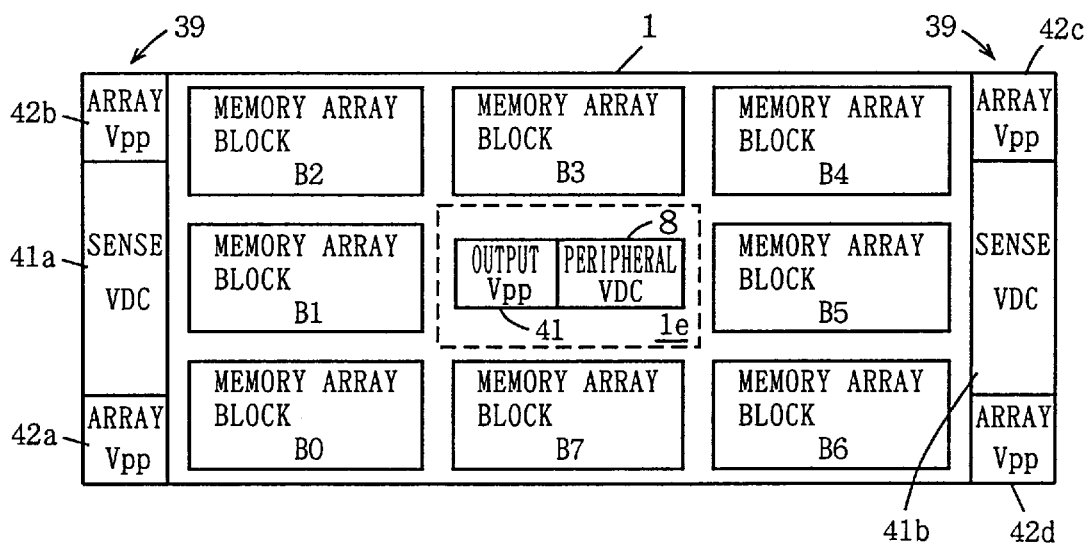
FIG. 21 is a schematic diagram of a general configuration of a semiconductor memory device according to a sixth embodiment of the invention.

FIG. 21 is a schematic diagram of the arrangement of power supply circuits in a semiconductor memory device according to a sixth embodiment of the invention. In FIG. 21, there are provided, in a central region 1e, a peripheral power supply circuit (peripheral VDC) 8 for supplying power supply voltage to the peripheral circuits of memory array blocks B0 to B7 and an output boosting power supply circuit (output Vpp) 41 for supplying boosted voltage Vpp to a data output buffer. Output boosting power supply circuit 41, the configuration of which will be described later, is provided for compensating for a loss by the threshold voltage of a MOS transistor when high level data is output in an output buffer stage.

In one of peripheral regions 39 on both sides of a semiconductor substrate region 1, a sense amplifier power supply circuit (sense VDC) 41a and array boosting power supply circuits (array Vpp) 42a and 42b are provided. In the other peripheral region 39, a sense amplifier power supply circuit 41b and array boosting power supply circuits 42c and 42d on its both sides are provided. Sense amplifier power supply circuit 41a supplies operation power supply voltage to the sense amplifiers in memory array blocks B0 to B3, and sense amplifier power supply circuit 41b supplies operation power supply voltage to sense amplifiers in memory array blocks B4 to B7. Array boosting power supply circuit 42a supplies boosted voltage Vpp to word line driving circuits included in memory array blocks B2 and B3. Array boosting power supply circuit 42c supplies boosted voltage Vpp to word line driving circuits included in memory array blocks B4 and B5, and array boosting power supply circuit 42 supplies boosted voltage Vpp to word line driving circuits in memory array blocks B6 and B7.

Figure 22:
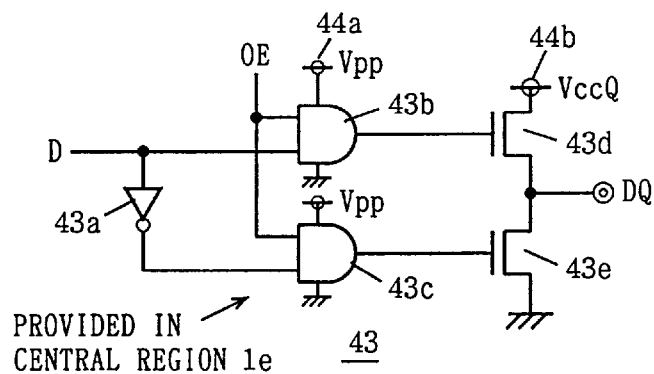
FIG. 22 is a diagram of an example of an output circuit to which the output boosted voltage as shown in FIG. 21 is transmitted.

FIG. 22 is a diagram of an example of the output buffer circuit which receives the output boosted voltage. Output buffer circuits 43 as shown in FIG. 22 are collectively provided in central region 1e. The necessary number of output buffer circuits 43 provided in central region 1e correspond to the number of data bits. The distances from memory array blocks B0 to B7 to output buffer circuits 43 are almost equal, and therefore it is not necessary to take into account a margin for output data determining timing in view of signal propagation delay, which permits high speed accessing.

In FIG. 22, output buffer circuit 43 includes an inverter 43a which receives internal read data D, an AND circuit 43b which receives an output enable signal OE and internal read data D, an AND circuit 43c which receives output enable signal OE and an output signal from inverter 43a, an n channel MOS transistor 43d which conducts when an output signal from AND circuit 43b is at an H level and outputs an H level signal to the output node, and an n channel MOS transistor 43e which conducts when an output signal from AND circuit 43c is at an H level and discharges the output node to a ground voltage level.

AND circuits 43b and 43c operate using boosted voltage Vpp applied from output boosting power supply circuit 41 at their boosting nodes 44a as one operation power supply voltage, and the H level of the output signals thereof is at the level of boosted voltage Vpp. These AND circuits 43b and 43c have a level converting function to raise the voltage level of read data D at the internal power supply voltage level. The drain of MOS transistor 43d is connected to power supply node 44b. Power supply node 44b is supplied with voltage VccQ from a power supply circuit dedicated for the output circuit which is not shown. Output power supply voltage VccQ is at the level of external power supply voltage.

When the output signal of AND circuit 43b is at an H level, MOS transistor 43d conducts. Voltage at power supply voltage VccQ level should be transmitted to the output node without a loss by the threshold voltage of MOS transistor 43d. Hence, the H level of the output signal of AND circuit 43b is set to a voltage level equal to or higher than the sum of power supply voltage VccQ and the threshold voltage of MOS transistor 43d. Thus, external read data DQ output from the output node has an H level equal to the level of power supply voltage VccQ.

MOS transistor 43e discharges the output node to the ground potential level. Thus, AND circuit 43c does not particularly have to output a signal at a boosted voltage level. Herein, AND circuit 43c is provided with the level converting function in order to simply increase the driving capability of MOS transistor 43e and to drive the output node to the ground voltage level at a high speed.

Central region 1e has an area almost identical to a memory array block providing region. Therefore, input/output circuits (input/output buffers) can be provided in central region 1e with enough margin. By supplying boosted voltage Vpp from output boosting power supply circuit 41 to output buffer circuit 43 included in these input/output circuits, data can be stably output at a high speed. Output boosting power supply circuit 41 can be provided in the vicinity of output buffer circuit 43 provided in central region 1e, therefore the length of the power supply line for output boosting power supply circuit 41 can be minimized, and output boosted voltage at a desired voltage level can be stably generated.

Figure 23:
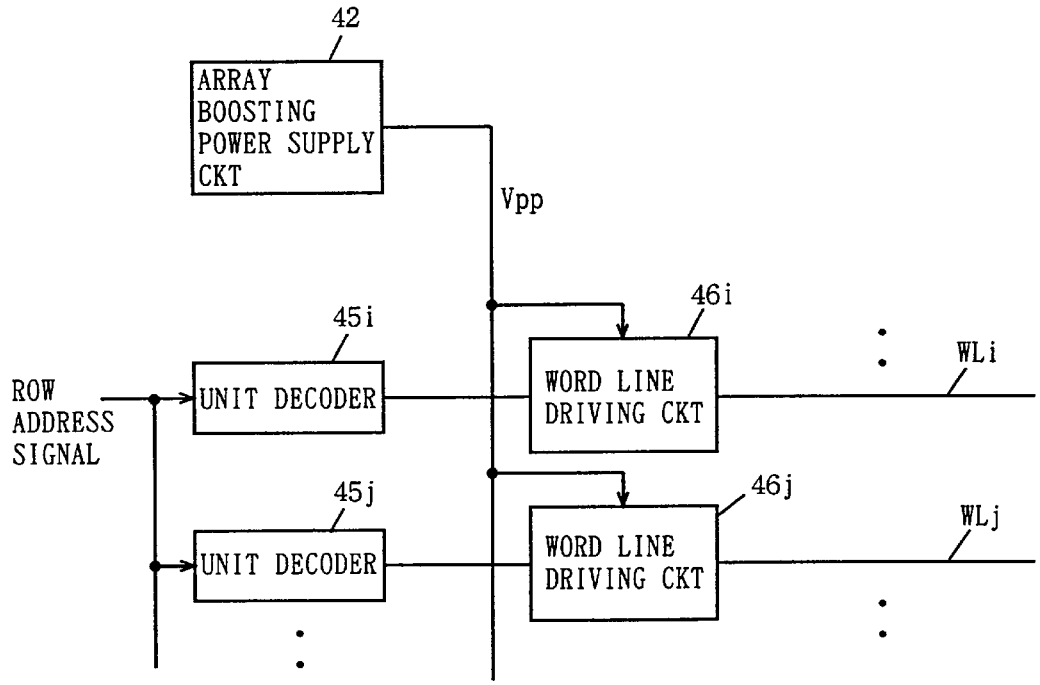
FIG. 23 is a schematic diagram of the configuration of a word line driving portion in the semiconductor memory device according to the sixth embodiment of the invention.

FIG. 23 is a schematic diagram of a portion which uses boosted voltage Vpp from array boosting power supply circuits 42a to 42d shown in FIG. 21. In FIG. 23, one memory array block is shown. In the memory array block, unit decoders 45i, 45j, . . . included in a row decoder are provided corresponding to word lines WLi, WLj, respectively. These unit decoders 45i, 45j, . . . output a signal in a selected state when an applied row address signal specifies a corresponding word line.

Word line driving circuits 46i, 46j, . . . are provided between unit decoders 45i, 45j, . . . and corresponding word lines WLi, WLj, . . . . These word line driving circuits 46i, 46j, . . . transmit boosted voltage Vpp from array boosting power supply circuit 42 (42a to 42d) to corresponding word lines WLi, WLj, . . . when signals from corresponding unit decoders 45i, 45j, . . . indicate a selected state. By driving a selected word line to the boosted voltage Vpp level, H level data at the power supply voltage level can be written in a memory capacitor without a loss by the threshold voltage of the access transistor.

A shown in FIG. 21, by providing array boosting power supply circuits 42a to 42d in peripheral regions 39, the length of the power supply lines from the array boosting power supply circuits to the memory array blocks is reduced, and therefore boosted voltage can be transmitted without a voltage drop.

Furthermore, array boosting power supply circuits 42a to 42d can be optimized for driving word lines in the two memory array blocks, so that an optimized array boosting power supply circuit can be implemented when the refresh cycle is changed. More specifically, in the 4K refresh cycle device, for example, all the array boosting power supply circuits 42a to 42d are operated, while in the 8K refresh cycle device, only one of array boosting power supply circuits 42a and 42b is used or only one of array boosting power supply circuits 42c and 42d is used. Thus, word lines can be driven into a selected state always using an optimized array boosting power supply circuit, even if the number of word lines selected at a time is different.

In FIG. 23, a word line driving circuit receives boosted voltage from array boosting power supply circuit 42 and transmits the received voltage onto a corresponding word line. However, a word line driving signal can be generated based on boosted voltage Vpp from the array boosting power supply circuit and on a row predecode signal, and the word line driving signal at the boosted voltage Vpp level can be transmitted onto a selected word line. In such a case, a unit decoder is provided for a plurality of word lines, and one of the plurality of word lines is driven into a selected state in response to the word line driving signal.

The word line driving portion can be implemented in any form in which boosted voltage Vpp from array boosting power supply circuit 42 is transmitted onto a selected word line.

Variation 1

Figure 24:
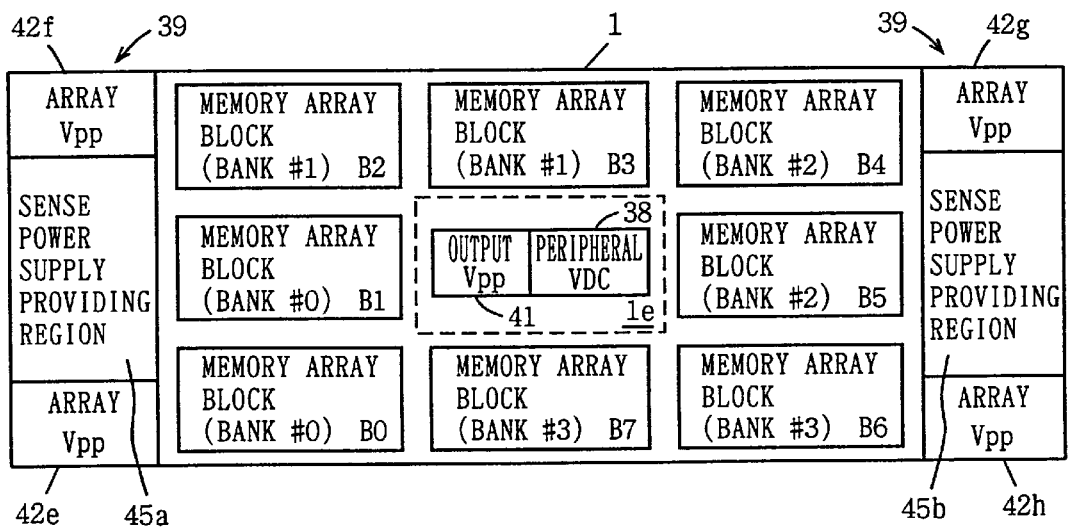
FIG. 24 is a schematic diagram of a variation of the sixth embodiment of the invention.

FIG. 24 is a schematic diagram of variation 1 of the sixth embodiment of the invention. In FIG. 24, memory array blocks B0 to B7 provided to surround the periphery of a central region 1e are divided into four banks #0 to #3. An output boosting power supply circuit 41 for supplying boosted voltage Vpp to an output circuit is provided in central region 1e similarly to the case of the single-bank arrangement, and a peripheral power supply circuit 38 for supplying power supply voltage to the peripheral circuits of memory array blocks B0 to B7 is provided in the common region. The output circuit provided in central region 1e is activated at the time of reading out data regardless of which bank is accessed. As a result, regardless of whether the memory device is in the single-bank arrangement or multi-bank arrangement, output boosting circuit 41 is provided in the vicinity of the output circuit.

In one of peripheral regions 39, an array boosting power supply circuit 42e for bank #0 and an array boosting power supply circuit 42f for bank #1 are provided, while in the other peripheral region 39, an array boosting power supply circuit 42g for bank #2 and an array boosting power supply circuit 42h for bank #3 are provided. In the region between array boosting power supply circuits 42e and 42f, a sense power supply providing region 45a for providing a sense amplifier power supply circuit is provided, while in the region between array power supply circuits 42g and 42h, a sense power supply providing region 45b for providing a sense amplifier power supply circuit is provided. Sense power supply providing regions 45a and 45b can be each provided with one sense amplifier power supply circuit, or a sense amplifier power supply circuit can be provided corresponding to each bank therein.

As shown in FIG. 20, by providing an array boosting power supply circuit corresponding to each bank, array boosted voltage can be supplied, depending upon the operation of each corresponding bank, to the banks which are activated/inactivated independently from each other to select/non-select a word line. As a result, by optimizing the current driving capability of a power supply circuit for generating array boosted voltage for each bank, boosted voltage Vpp can be stably supplied when corresponding banks are activated, and boosted voltage at a desired voltage level can be stably supplied even if word lines are sequentially driven into a selected state at a high speed. Thus, contrary to the arrangement in which the current driving capability of the array boosting power supply circuit is increased for the purpose of high speed operation to prevent the situation that boosted voltage Vpp is abruptly lowered when a word line is selected and next word line selection is carried out before the lowered voltage level is returned to the original level, the current supplying capability of each array boosting power supply circuit can be optimized, so that unnecessary current consumption can be prevented, which leads to reduced power consumption.

By providing two array booting power supply circuits in each of peripheral regions 39, the optimized two array boosting power supply circuits can be operated in parallel in the 4-bank arrangement, so that also in the 2-bank arrangement semiconductor memory device, a word line can be stably driven into a selected state.

As in the foregoing, according to the sixth embodiment of the invention, since a plurality of array boosting power supply circuits for driving a word line are provided in the peripheral regions of a semiconductor substrate region, one array boosting power supply circuit can be provided for a prescribed number of memory blocks or banks. Thus, boosted voltage Vpp for driving a word line can be generated by an optimized current driving capability, boosted voltage for word line at a prescribed voltage level can be stably generated and transmitted onto a selected word line. Since an array boosting power supply circuit is provided in a peripheral region, the array boosting power supply circuit including a charge pump circuit, for example, can be formed in the region with a sufficient area margin.

Seventh Embodiment

Figure 25:
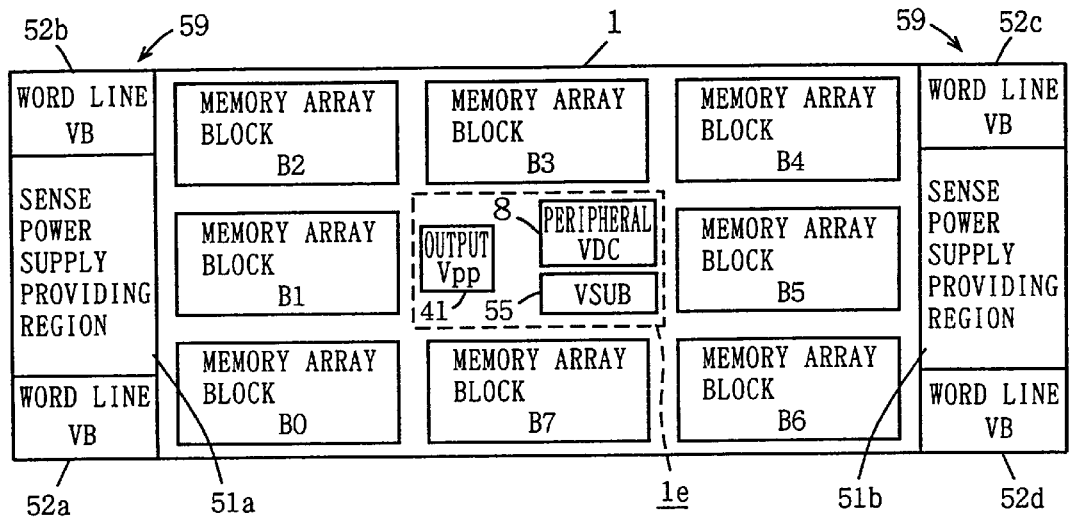
FIG. 25 is a schematic diagram of a general configuration of a semiconductor memory device according to a seventh embodiment of the present invention.

FIG. 25 is a schematic diagram of a general arrangement of a semiconductor memory device according to a seventh embodiment of the invention. In FIG. 25, in a peripheral region 59 of a semiconductor substrate region 1, word line negative voltage generation circuits (word line VB) 52a to 52d formed of a charge pump circuit, for example, for generating negative voltage to be transmitted onto a non-selected word line are provided. Between word line negative voltage generation circuits 52a and 52b provided in one peripheral region 59, a sense power supply providing region 51a for providing a sense amplifier power supply circuit is provided, and in the other peripheral region 59, between word line negative voltage generation circuits 52c and 52d, a sense power supply providing region 51b for providing a sense amplifier power supply circuit is provided. In sense power supply providing regions 51a and 51b, one or more sense amplifier power supply circuits are provided.

Word line negative voltage generation circuit 52a transmits word line negative voltage to memory array blocks B0 and B1, while word line negative voltage generation circuit 52b transmits word line negative voltage to memory blocks B2 and B3. Word line negative voltage generation circuit 52c transmits word line negative voltage to memory array blocks B3 and B4, while word line negative voltage generation circuit 52a transmits word line negative voltage to memory array blocks B6 and B7. These memory array blocks B0 to B7 form one bank (single-bank arrangement).

In central region 1e surrounded by memory array blocks B0 to B7, there are provided an output boosting power supply circuit 41 for applying boosted voltage Vpp to the output circuit and a peripheral power supply circuit (peripheral VDC) 8 for supplying power supply voltage to peripheral circuits included in memory array blocks B0 to B7. Also provided in central region 1e is a substrate bias voltage generation circuit 55 for applying negative substrate bias VSUB to a substrate region in which the memory cell arrays of memory array blocks B0 to B7 are formed. Substrate bias voltage VSUB is applied to the backgate of an access transistor in a memory cell. Substrate bias voltage VSUB restricts the formation of a parasitic MOS transistor, and stabilizes the threshold voltage of an access transistor. Since the substrate bias voltage is applied to the substrate region of the memory cell array (the backgate of the access transistor) regardless of the operation mode itself, substrate bias voltage VSUB from substrate bias voltage generation circuit 55 is commonly provided to memory array blocks B to B7 in central region 1e.

Figure 26:
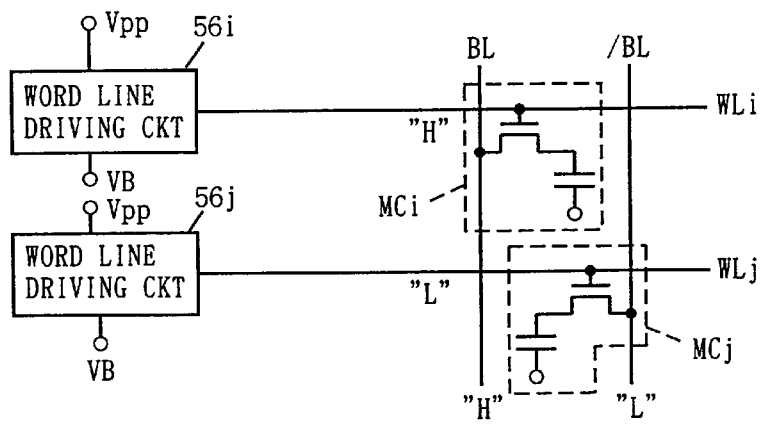
FIG. 26 is a schematic diagram of the configuration of a word line driving portion according to the seventh embodiment of the invention.

FIG. 26 is a diagram showing the configuration of a word line driving portion included in each of memory array blocks B0 to B7. In FIG. 26, two word lines WLi and WLj included in a single memory array block are generically shown. Word line driving circuits 56i and 56j for driving word lines WLi and WLj into a selected state or a nonselected state according to a word line designation signal from a decoder which is not shown are provided corresponding to word lines WLi and WLj. Word line driving circuits 56i and 56j transmit one of boosted voltage Vpp and negative voltage VB to corresponding word lines WLi and WLj. Word line negative voltage VB is supplied from a corresponding word line negative voltage generation circuit. A word line in a selected state is driven into an H level at the level of boosted voltage Vpp. In a non-selected state, the word line is driven into an L level at the level of negative voltage VB.

Now, let us assume that word line WLi is selected while word line WLj is not selected. Bit lines BL and /BL are provided crossing these word lines WLi and WLj, a memory cell MCi is provided corresponding to the crossing portion of bit line BL and word line WLi, and a memory cell MCj is provided corresponding to the crossing portion of word line WLj and bit line /BL. When word line WLi is driven into a selected state, the voltage level of non-selected word line WLj is also raised by capacitance coupling. When a word line is selected, bit lines BL and /BL are held in a floating state at an intermediate voltage level. Also in this case, when the voltage level of non-selected word line WLj is raised, the gate potential of an access transistor in memory cell MCj increases, and the subthreshold current increases. Thus, if memory cell MCj holds H level data, charge is allowed to flow from the memory cell capacitor to bit line /BL.

Bit lines BL and /BL cross word lines WLi and WLj, and parasitic capacitance is present at the crossing portions. If memory cell MCi holds H level data, bit line BL is driven into an H level by a sense amplifier circuit which is not shown. Meanwhile, bit line /BL is driven into an L level. At the time of the operation of the sense amplifier circuit, a sense amplifier formed of n channel MOS transistors operates first, followed by the operation of a sense amplifier formed of p channel MOS transistors. As a result, if bit line /BL is driven into an L level, then bit line BL is driven into an H level, and the voltage level of word line WLj is raised by capacitance coupling between bit line BL and word line WLj, the access transistor in memory cell MCj attains a weak conducting state, and charge is allowed to flow from the capacitor in memory cell MCj to bit line /BL. This is also true to the case in which non-selected word line WLj holds a raised voltage through capacitance coupling when a word line is selected.

If the operation is repeated, during selecting a word line and a sensing/amplifying operation charge is allowed to flow out from the memory cell capacitor to lower the voltage level of H level data. The series of operations are usually called "disturb refresh", and in order to prevent destruction of H level data caused by the loss of charge by such a floating up of the potential of the non-selected word line, the non-selected word line is held at an L level at the level of negative voltage VB. Thus, even if the non-selected word line potential increases, its voltage level is equal to or lower than the ground voltage, the access transistor can be held in an off state, and the disturb refresh characteristic can be improved.

Negative voltage to the non-selected word line is applied from word line negative voltage generation circuits 52a to 52d. If a selected word line is driven into a non-selected state, negative voltage VB is transmitted onto the selected word line. Therefore, when a memory array block returns to a non-selected state, current is consumed by word line negative voltage generation circuits 52a to 52d. However, as shown in FIG. 25, word line negative voltage generation circuits 52a to 52d are distributed to transmit word line negative voltage through a negative voltage transmission line having a minimum line length to a memory array block in the vicinity, desired voltage level negative voltage can be stably transmitted to a corresponding memory array block. Even if selection/non-selection of a word line is repeated at a high speed, each of word line negative voltage generation circuits 52a to 52d can generate desired voltage level negative voltage stably with current driving capabilities smaller than that required for transmitting negative voltage to all the memory array blocks B0 to B6.

Variation

Figure 27:
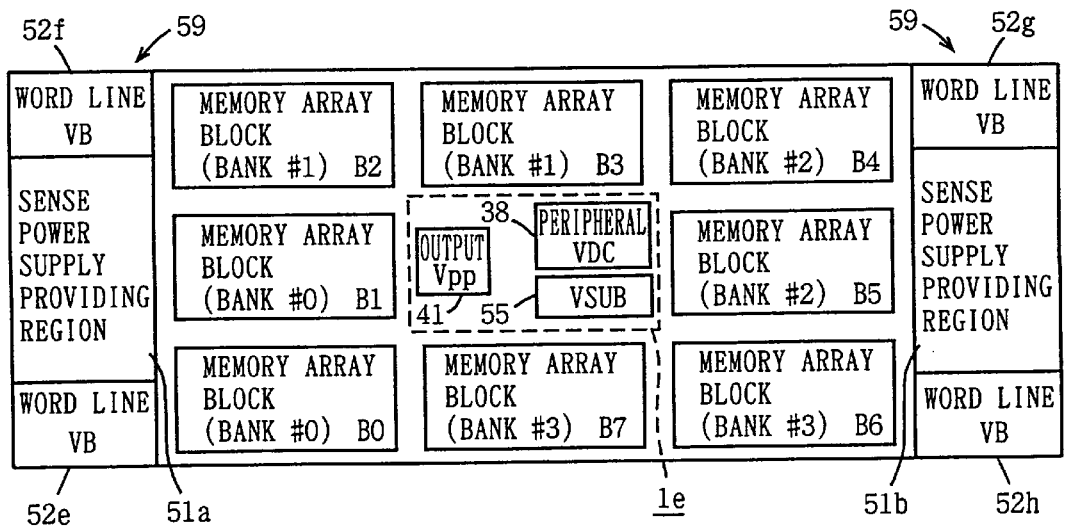
FIG. 27 is a schematic diagram of a variation of the seventh embodiment of the invention.

FIG. 27 is a diagram showing the configuration of a variation of the seventh embodiment of the invention. In FIG. 27, memory array blocks B0 to B7 provided to surround a central region 1e are divided into four banks #0 to #3. Banks #0 to #3 each include two memory array blocks adjacent to each other. In central region 1e, as is the case with the arrangement shown in FIG. 25, an output boosting power supply circuit 41, a peripheral power supply circuit 38, and a substrate bias voltage generation circuit 55 are provided.

In one of peripheral regions 59, word line negative voltage generation circuits (word lines VB) 52e and 52f are provided corresponding to banks #0 and #1, while in the other peripheral region 59, word line negative voltage generation circuits 52g and 52h are provided corresponding to banks #2 and #3. In the region between word line negative voltage generation circuits 52a and 52f, a sense power supply providing region 51a is provided, while in the region between word line negative voltage generation circuits 52g and 52h, a sense power supply providing region 1b is provided.

In sense power supply providing regions 51a and 51b, a sense amplifier power supply circuit is provided corresponding to each of the banks. Sense power supply providing region 51a is provided with a sense amplifier power supply circuit corresponding to bank #0 and a sense amplifier power supply circuit corresponding to bank #1. In sense power supply providing region 51b, sense amplifier power supply circuits are provided corresponding to banks #2 and #3.

As shown in FIG. 27, by providing word line negative voltage generation circuits 52e to 52h corresponding to banks #0 to #3, the line distance between a bank and a corresponding word line negative generation circuit can be reduced, and desired voltage level negative voltage can be stably transmitted to the memory array block (bank). Even if banks #0 to #3 are driven into a selected/non-selected state independently from each other, word line negative voltage can be stably transmitted by a corresponding word line negative generation circuit. Thus, in the bank arrangement, word line negative voltage is stably supplied to select/non-select a word line at a high speed, which permits high speed operation.

As described above, according to the seventh embodiment of the invention, since a circuit for generating word line negative voltage transmitted to a non-selected word line is provided for a prescribed number of memory blocks, and therefore negative voltage can be stably transmitted onto a non-selected word line. Particularly in the bank-arrangement, by providing a word line negative voltage generation circuit corresponding to a bank, when the negative voltage is consumed at the time of driving a bank into a non-selected state, the word line negative voltage generation circuit can surely restrict the fluctuation of the negative voltage level in a memory array block in a corresponding bank. The word line negative voltage generation circuit needs only supply word line negative voltage to a memory array block in a corresponding bank, and current supplying capability more than necessary is not required, so that unnecessary current consumption can be prevented.

Also, by optimizing a word line negative voltage generation circuit in the 4-bank arrangement, word line negative voltage can be stably supplied onto a non-selected word line by simply operating two word line negative voltage circuits each optimized for two memory array blocks at a time even if the 2-bank arrangement is used instead of a 4-bank arrangement. Thus, in any of the 4-bank arrangement and 2-bank arrangement, an optimized word line negative voltage generation circuit can be implemented.

Note that the word line negative voltage generation circuit can be implemented by a normal charge pump circuit which generates negative voltage (the same is true for the substrate bias voltage generation circuit.)

Eighth Embodiment

Figure 28:
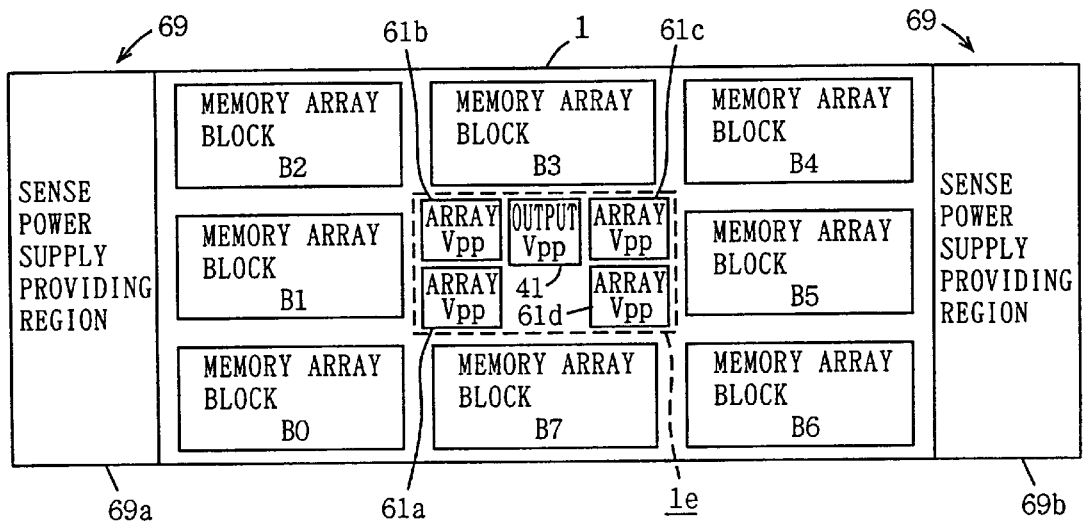
FIG. 28 is a schematic diagram of a general configuration of a semiconductor memory device according to an eighth embodiment of the invention.

FIG. 28 is a schematic diagram of a general arrangement of elements in a semiconductor memory device according to an eighth embodiment of the invention. In FIG. 28, array boosting power supply circuits 61a, 61b, 61c and 61d are provided in the four corner regions of a central region 1e. Memory array blocks B0 to B7 provided to surround central region 1e form a bank (single-bank arrangement). Array boosting power supply circuit 61a supplies boosted voltage Vpp to memory array blocks B0 and B1, array boosting power supply circuit 61b supplies boosted voltage Vpp to memory array blocks B2 and B3. Array boosting power supply circuit 61c supplies boosted voltage to memory array blocks B4 and B5, and array boosting power supply circuit 61d supplies boosted voltage Vpp to memory array blocks B6 and B7.

By providing an array boosting power supply circuit corresponding to each two memory array blocks at the four corners of central region 1e, one array boosting power supply circuit needs only supply boosted power supply voltage to the two memory array blocks, and the boosted voltage can be stably supplied. Furthermore, by providing array boosting power supply circuits at the four corners of central region 1e, the line length between each boosting power supply circuit and a corresponding memory array block can be minimized, boosted voltage at a desired voltage level can be stably supplied without the influence of the line impedance of the boosted power supply line.

In the arrangement shown in FIG. 28, array boosting power supply circuits 61a and 61b may commonly supply boosted voltage Vpp to memory array blocks B0 to B3, while array boosting power supply circuits 61c and 61d may commonly supply boosted voltage Vpp to memory array blocks B4 to B7. In that case, one array boosting power supply circuit is optimized to the 8K refresh cycle. If the semiconductor memory device is used as a 4K refresh cycle device, array boosting power supply circuits 61a to 61d are all operated. Meanwhile, if the device is used as a 8K refresh cycle device, only one of array boosting power supply circuits 61a and 61b is operated, or only one of array boosting power supply circuits 61c and 61d is operated. Thus, in any of the 8K refresh cycle device and 4K refresh cycle device, array boosting power supply circuits having optimized current driving capabilities can be implemented.

In peripheral regions 69 on both sides of semiconductor substrate region 1 in the longer-side direction, there are provided sense power supply providing regions 69a and 69b for providing sense amplifier power supply circuits. In sense power supply providing regions 69a and 69b, one sense amplifier power supply circuit can be provided, or a plurality of sense amplifier power supply circuits can be provided.

Variation

Figure 29:
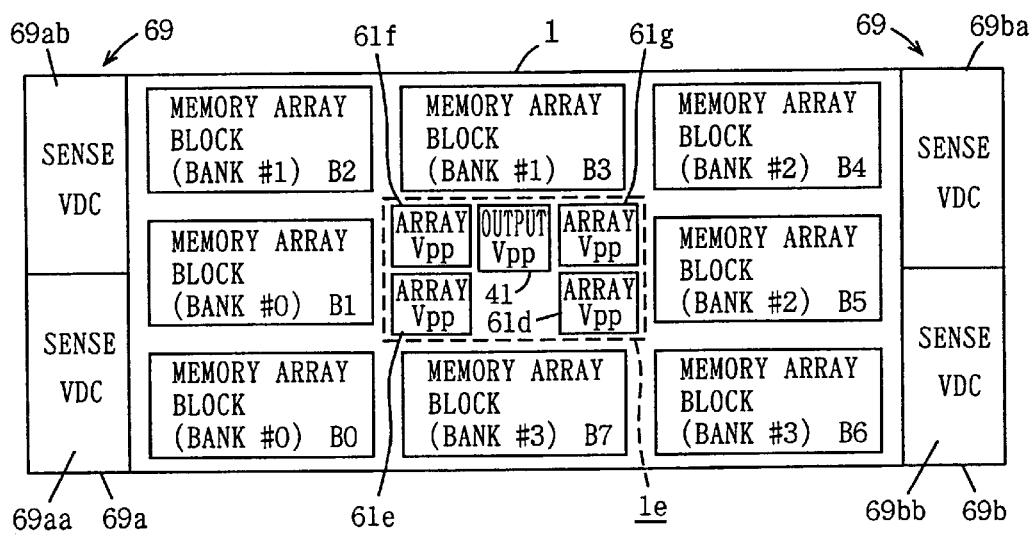
FIG. 29 is a schematic diagram of a variation of the eighth embodiment of the invention.

FIG. 29 is a diagram showing the configuration of a variation of the eighth embodiment of the invention. In the configuration shown in FIG. 29, memory array blocks B0 to B7 are divided into four banks #0 to #3. Banks #0 to #3 each include two adjacent memory array blocks. In central region 1e, array boosting power supply circuits 61e to 61h are provided corresponding to banks #0 to #3 respectively at the four corners of central region 1e so that the line length to a corresponding bank is minimized.

Array boosting power supply circuits 61 to 61h are activated when a corresponding memory bank is activated, and supply boosted voltage Vpp to the memory array blocks in the corresponding bank. Therefore, array boosting power supply circuits 61e to 61h need only supply current for holding the boosted voltage only when a corresponding memory bank is operated. By optimizing array boosting power supply circuits 61e to 61h to supply boosted voltage by sufficient current driving capability to one corresponding bank, current more than necessary will not be consumed when the boosted voltage is generated, and necessary boosted voltage can be held at a desired voltage level with reduced power consumption.

In sense power supply providing regions 69a and 69b provided in peripheral regions 69 on both sides of semiconductor substrate region 1 in the longer-side direction, sense amplifier power supply circuits 69aa, 69ab, 69ba and 69b b are provided corresponding to banks #0 to #3, respectively. Thus by providing a sense amplifier power supply circuit corresponding to each bank, the same effect as the fourth embodiment can be brought about.

Note that an output boosting power supply circuit 41 for transmitting boosted voltage Vpp to the output circuit is provided in central region 1e. Output boosting power supply circuit 41 transmits boosted voltage to the output circuit regardless of the bank arrangement. In central region 1e, a power supply circuit for peripheral devices and a substrate bias voltage generation circuit are also provided. Central region 1e occupies almost the same area as a region for providing a memory array block. Therefore, the boosting power supply circuits and the power supply circuits can be provided with enough margin.

As in the foregoing, according to the eighth embodiment of the invention, since array boosting power supply circuits are provided at the four corner regions of the central region corresponding to a prescribed number of memory array blocks, boosted voltage at a desired voltage level can be stably supplied to the memory array blocks with minimum current driving capability and in the minimum line length.

Note that, in the bank arrangement shown in FIG. 29, by optimizing each of array boosting power supply circuits 61e to 61h for one bank, optimized array boosting power supply circuits can be implemented, because two array boosting power supply circuits are activated when four memory array blocks operate in the two-bank arrangement.

Ninth Embodiment

Figure 30:
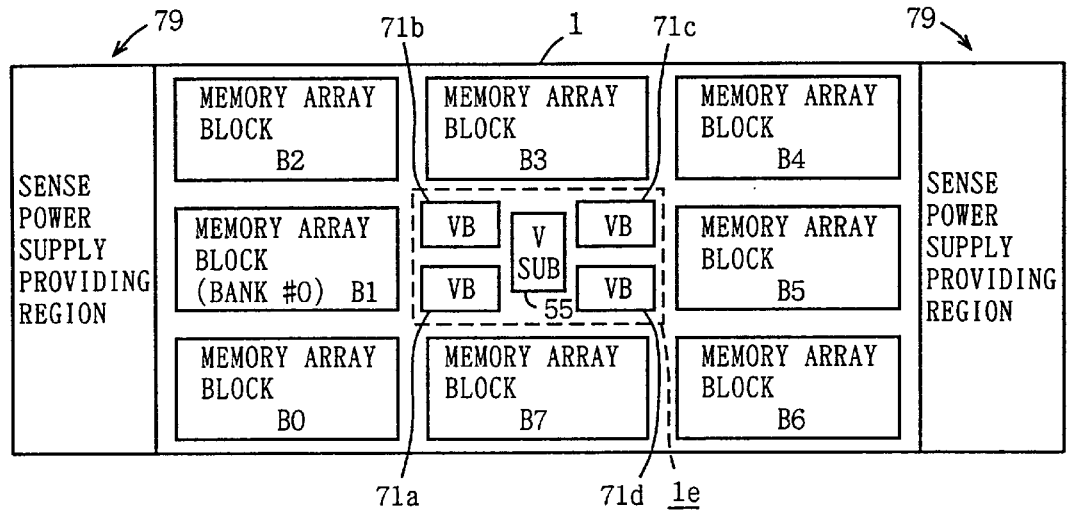
FIG. 30 is a schematic diagram of a general configuration of a semiconductor memory device according to a ninth embodiment of the invention.

FIG. 30 is a schematic diagram of an arrangement of components of a semiconductor memory device according to a ninth embodiment of the invention. In FIG. 30, memory array blocks B0 to B7 provided to surround a central region 1e in a semiconductor substrate region 1 form one bank. In central region 1e, there are provided at the four corner regions of central region 1e, word line negative voltage generation circuits (VB) 71a, 71b, 71c and 71d. There is also provided in central region 1e a substrate bias voltage generation circuit (VSUB) 55 for generating substrate bias voltage.

Word line negative voltage generation circuit 71a supplies negative voltage VB to memory array blocks B0 and B1, word line negative voltage generation circuit 71b supplies word line negative voltage to memory array blocks B2 and B3, and word line negative voltage generation circuit 71c supplies word line negative voltage to memory array blocks B4 and B5. Word line negative voltage generation circuit 71a supplies word line negative voltage to memory array blocks B0 and B7.

In peripheral regions 79 on both sides of semiconductor substrate region 1 in the longer-side direction, sense power supply providing regions for providing sense amplifiers are provided. One or more sense amplifiers are provided in each sense power supply providing region 79.

By providing word line negative voltage generation circuits 71a to 71d at the four corners of central region 1e, the length of a negative voltage transmission line to a corresponding memory array block is minimized, so that word line negative voltage can be stably supplied without the influence of the line impedance. Word line negative voltage generation circuits 71a to 71d each need only supply word line negative voltage to two memory array blocks, in other words do not need large current driving capability, so that necessary voltage level word line negative voltage can be stably generated and transmitted to corresponding memory array blocks.

In the arrangement shown in FIG. 30, word line negative voltage generation circuits 71a to 71d serving as a 8K refresh cycle device can be optimized as a 4K refresh cycle device by connecting the outputs of two word line negative voltage generation circuits commonly to the negative voltage transmission line. Thus, optimized word line negative voltage generation circuits for any of the 4K refresh cycle device and 8K refresh cycle device can be readily implemented.

Variation

Figure 31:
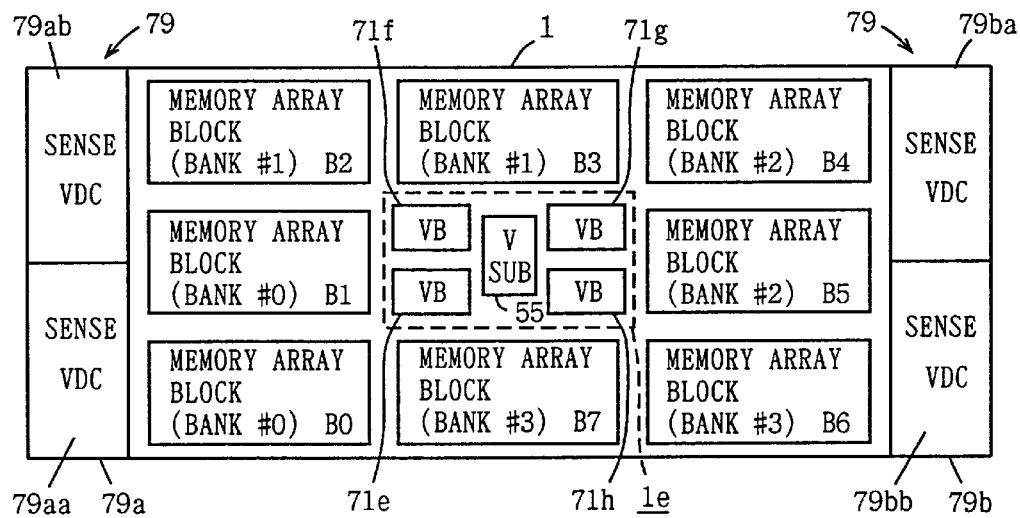
FIG. 31 is a schematic diagram of a variation of the ninth embodiment of the invention.

FIG. 31 is a schematic diagram of a variation of the ninth embodiment of the invention. In the configuration shown in FIG. 31, memory array blocks B0 to B7 provided to surround a central region 1e are divided into four banks #0 to #3. Banks #0 to #3 each include two memory array blocks provided adjacent to each other. Corresponding to banks #0 to #3 at the four corner regions of central region 1e, word line negative voltage generation circuits 71e to 71h are provided. In central region 1e, peripheral power supply circuits are also provided, but in FIG. 31 a substrate bias voltage generation circuit 55 for generating substrate bias voltage VSUB is generically shown.

Sense power supply providing regions 79a and 79b are provided in peripheral regions 79 on both sides of a semiconductor substrate region 1 in the longer-side direction. Sense amplifier power supply circuits are provided corresponding to the banks in sense power supply providing regions 79a and 79b. A sense amplifier power supply circuit 79aa is provided for bank #0, a sense amplifier power supply circuit 79a b for bank #1, a sense amplifier power supply circuit 79ba for bank #2, and a sense amplifier power supply circuit 79b b for bank #3 in sense power supply providing region 79b. Thus by providing a sense amplifier power supply circuit corresponding to each bank, the same effect as the fourth embodiment can be provided.

By providing negative voltage generation circuits 71e to 71h corresponding to the banks at the four corner regions of central region 1e and activating these negative voltage generation circuits in response to the operation of corresponding banks, word line negative voltage can be stably supplied with minimum necessary current supplying capability to a bank in operation from a corresponding word line negative voltage generation circuit. Word line negative voltage generation circuits 71e to 71h can be optimized for banks each including two memory array blocks so that the 4 bank arrangement semiconductor memory device can be used as a 2-bank arrangement semiconductor memory device.

As described above, according to the ninth embodiment, since word line negative voltage generation circuits are provided corresponding to a plurality of memory array blocks at the four corner regions of a central region, word line negative voltage can be transmitted to a corresponding memory array through the minimum line length, and word line negative voltage at a desired level can be stably supplied. Furthermore, by providing a word line negative voltage generation circuit corresponding to each bank, a corresponding word line negative voltage generation circuit selectively supplies negative voltage to a bank in operation, word line negative voltage at a desired voltage level can be stably generated and transmitted with the minimum necessary current supplying capability.

By providing a sense amplifier power supply circuit corresponding to each bank, the same effect as the fourth embodiment can be provided.

Tenth Embodiment

Figure 32A:
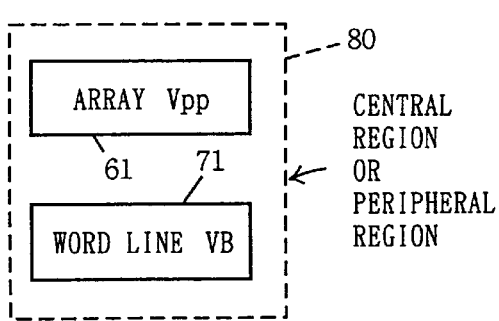
FIG. 32A is a diagram showing a main part of a semiconductor memory device according to a tenth embodiment of the invention.

FIG. 32A is a diagram showing the configuration of a main part of a semiconductor memory device according to a tenth embodiment of the invention. In FIG. 32A, a word line voltage generation circuit 80 includes an array boosting power supply circuit (array Vpp) 61 for generating array boosted voltage Vpp, a word line negative voltage generation circuit (word line VB) 71 for generating negative voltage VB transmitted to a word line. Word line negative voltage generation circuit 80 is provided in any of the central region and the peripheral region. By collectively providing the portions generating voltage transmitted to the word lines, the interconnection layout can be simplified. In addition, by providing array boosting power supply circuit 61 and word line negative voltage generation circuit 71 corresponding to a prescribed number of memory array blocks, the same effect as the foregoing embodiments can be provided.

Variation

Figure 32B:
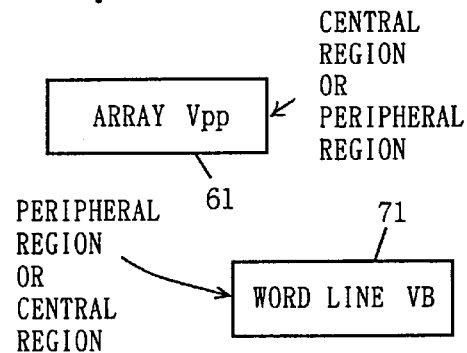
FIG. 32B is a schematic diagram of a variation of the tenth embodiment of the invention.
Figure 33:
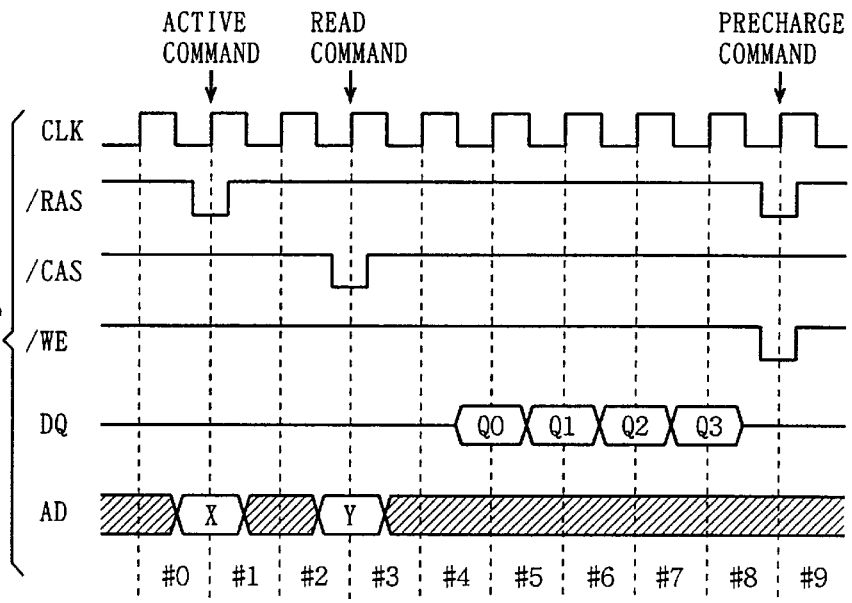
FIG. 33 is a diagram showing a data reading operation sequence by a conventional clock synchronous type semiconductor memory device.
Figure 34:
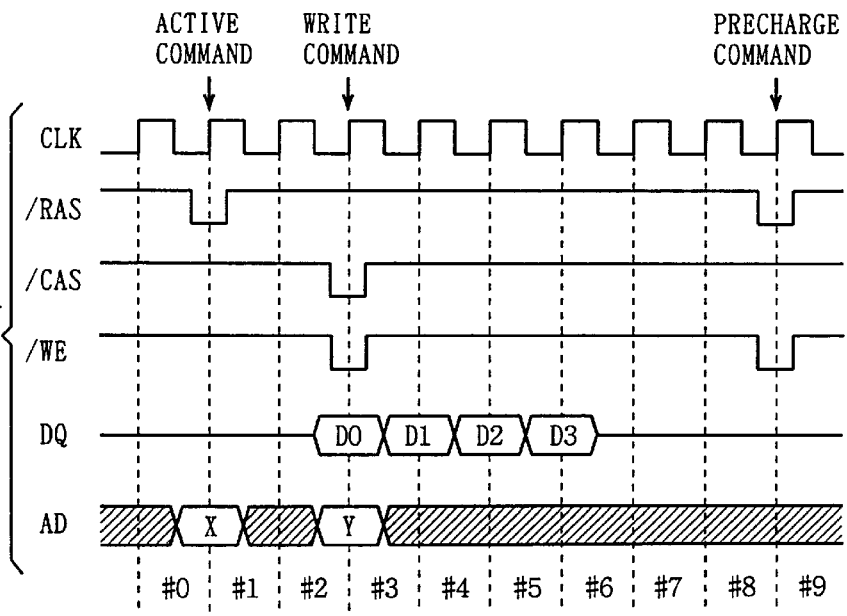
FIG. 34 is a diagram showing a data writing operation sequence by a conventional clock synchronous semiconductor memory device.
Figure 35:
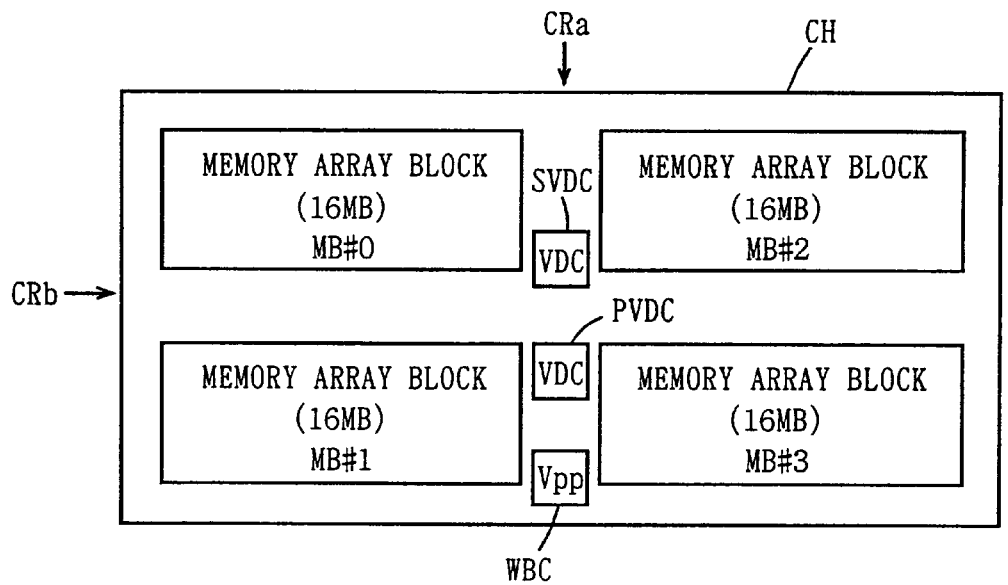
FIG. 35 is a schematic diagram of the arrangement of arrays and the arrangement of internal power supply circuits in a conventional semiconductor memory device.
Figure 36:
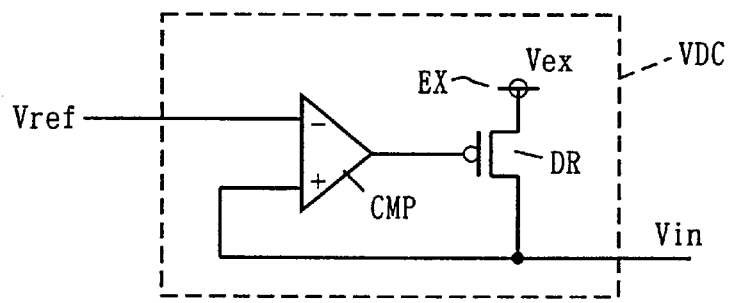
FIG. 36 is a diagram showing an example of configuration of a conventional internal power supply down converting circuit.
Figure 37:
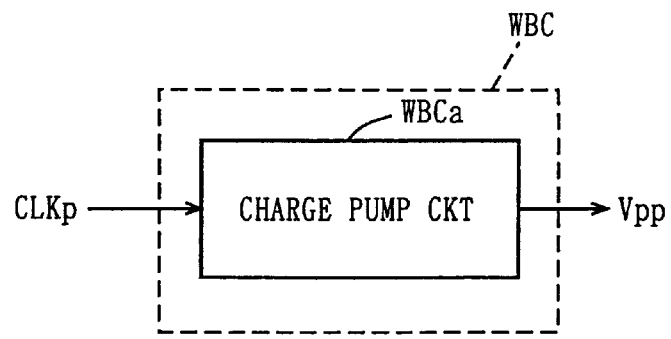
FIG. 37 is a schematic diagram of the configuration of a conventional boosting power supply circuit.
Figure 38:
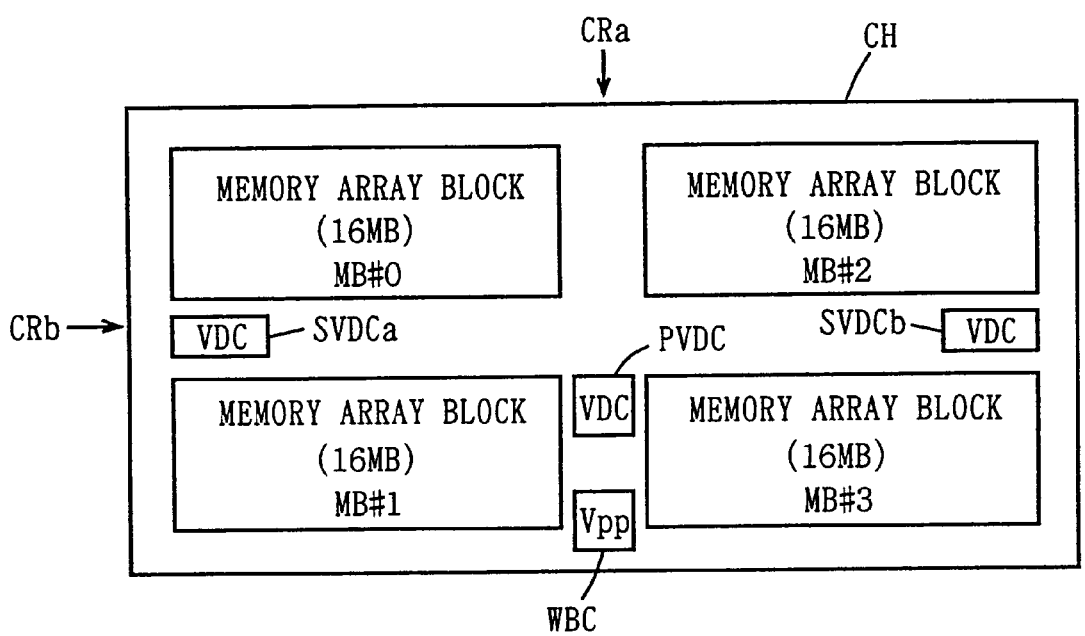
FIG. 38 is a diagram showing a variation of the arrangement of arrays and internal power supply circuits in a conventional semiconductor memory device.

FIG. 32B is a diagram showing a variation of the tenth embodiment of the invention. In FIG. 32B, an array boosting power supply circuit 61 and a word line negative voltage generation circuit 71 are provided in separate regions. More specifically, if array boosting power supply circuit 61 is provided in a central region, word line negative voltage generation circuit 71 is provided in a peripheral region. Conversely, if array boosting power supply circuit 61 is provided in the peripheral region, word line negative voltage generation circuit 71 is provided in the central region. In this case, boosted voltage Vpp and negative voltage VB having different voltage polarities are generated in the regions separate from each other, boosted voltage Vpp and negative voltage VB at a desired voltage level can be stably generated without the influence of the interaction of these boosted voltage and negative voltage. These array boosting power supply circuit and word line negative generation circuit are provided corresponding to a prescribed number of memory array blocks as is the case with the foregoing embodiments, and the same function and effects as the foregoing embodiments are provided.

As described above, according to the tenth embodiment of the invention, array boosted power supply voltage Vpp and word line negative voltage VB are generated from circuits provided corresponding to a prescribed number of memory blocks, a word line can be driven into a selected/non-selected state with minimum necessary current consumption, and therefore the word line can be selected at a high speed.

Other Applications

In the above-description, the number of banks is 1, 2 or 4. However, the memory array blocks may each serve as a bank, and the number of banks can be 8. Furthermore, the memory array blocks can be further divided into banks, and the number of banks can be further increased. As long as the memory array blocks are provided to surround central region 1e, the present invention is applicable.

In the above description, a synchronous type Dynamic Random Access Memory operating in synchronization with a clock signal is shown. However, the present invention is similarly applicable to a memory such as flash memory which internally generates power supply voltage.

As in the foregoing, according to the present invention, for a plurality of memory blocks provided to surround a central region in a semiconductor substrate region, array power supply circuits for generating power supply voltage used in memory blocks are provided each for a prescribed number of memory blocks in a distributed manner in the peripheral region or central region, internal voltage can be generated and supplied stably to a corresponding memory block with minimum necessary current driving capability, so that a semiconductor memory device operating stably at a high speed can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a plurality of memory blocks provided separated from each other along four sides of a central region positioned at a central portion of a rectangular semiconductor substrate region to surround the central region and each including a plurality of memory cells arranged in a matrix of rows and columns;
   a plurality of array power supply circuits provided in peripheral regions positioned outside said plurality of memory blocks at both end portions of said rectangular semiconductor substrate region along a first direction for generating voltages transmitted to memory cells in said plurality of memory blocks; and
   a control circuit provided in said central region for controlling accessing to said plurality of memory blocks.

2. The semiconductor memory device as recited in claim 1, wherein
   said plurality of memory blocks each include a sense amplifier circuit receiving the voltage from an array power supply circuit among said array power supply circuits for sensing and amplifying data in a selected memory cell.

3. The semiconductor memory device as recited in claim 1, wherein
   said plurality of memory blocks each include a plurality of word lines provided corresponding to each row of memory cells and having a corresponding row of memory cells connected thereto, and wherein said semiconductor memory device further comprises,
   a row selecting circuit which receives voltage from an array power supply circuit among said array power supply circuits for driving a word line provided corresponding to an addressed row into a level of the voltage received from the array power supply circuit.

4. The semiconductor memory device as recited in claim 1, wherein
   said plurality of array power supply circuits each include,
   a sense power supply circuit provided at a central portion of a corresponding peripheral region along a second direction orthogonal to the first direction for generating a power supply voltage used to sense and amplify data in a selected memory cell, and
   a row driving voltage generation circuit provided at both sides of said central portion along said second direction for generating a voltage to drive an addressed row of memory cells into a selected state.

5. The semiconductor memory device as recited in claim 2, wherein
   said array power supply circuits are provided one for a prescribed number of memory blocks among said plurality of memory blocks.

6. The semiconductor memory device as recited in claim 1, further comprising a peripheral power supply circuit provided, in said central region, corresponding to a prescribed number of memory blocks for generating a power supply voltage to a peripheral circuit for performing an operation related to select a memory cell included in each of the corresponding memory blocks.

7. The semiconductor memory device as recited in claim 1, further comprising data input/output circuitry provided in said central region for externally inputting and outputting data, and
   a data output power supply circuit provided in said central region for generating one operation power supply voltage to said data input/output circuitry.

8. The semiconductor memory device as recited in claim 1, further comprising a plurality of row driving voltage generation circuits each provided corresponding to a prescribed number of memory blocks among said plurality of memory blocks in said central region and each for generating a voltage to be transmitted to a memory cell row in a corresponding memory block.

9. The semiconductor memory device as recited in claim 8, wherein said central region has a rectangular form and said plurality of row driving voltage generation circuits are provided corresponding to the four corner regions of the rectangular central region.

10. The semiconductor memory device as recited in claim 8, wherein
    said plurality of memory blocks each include a plurality of word lines provided corresponding to each row of said plurality of memory cells and each having a corresponding row of memory cells connected thereto, and
    said row driving voltage generation circuit includes a circuit for generating a voltage to be transmitted onto a word line provided corresponding to an addressed row.

11. The semiconductor memory device as recited in claim 9, wherein
    said plurality of memory blocks each include a plurality of word lines provided corresponding to each memory cell row and each having a corresponding row of memory cells connected thereto, and
    said row driving voltage generation circuit includes a circuit for generating a voltage transmitted onto a word line provided corresponding to a non-selected row other than an addressed row.

12. The semiconductor memory device as recited in claim 1, wherein
    said plurality of memory blocks are divided into a plurality of banks driven into an active state and an inactive state independently from each other, and said plurality of banks each include a prescribed number of the memory blocks.

13. The semiconductor memory device as recited in claim 12, wherein said plurality of banks each include memory blocks positioned point-symmetrically with respect to said central region.

14. The semiconductor memory device as recited in claim 12, wherein said plurality of banks each include memory blocks provided adjacent to each other.

15. The semiconductor memory device as recited in claim 1, wherein said semiconductor substrate region is divided into subregions arranged in a plurality of rows and columns, said plurality of memory blocks are each provided in a subregion excluding a subregion corresponding to said central region, and said control circuit is provided in the subregion corresponding to said central region.

16. A semiconductor memory device, comprising:

a plurality of memory blocks provided to surround a central region in a rectangular semiconductor substrate region and each having a plurality of memory cells; and a control circuit provided in said central region for controlling accessing to said plurality of memory blocks, said plurality of memory blocks being divided into a plurality of banks driven into an active state and an inactive state independently from each other under the control of said control circuit, said plurality of banks each including memory blocks provided point-symmetrically to said central region.

17. The semiconductor memory device as recited in claim 16, wherein said semiconductor substrate region is divided into subregions in a plurality of rows and columns, said plurality of memory blocks are provided one in each of the subregions excluding a subregion corresponding to said central region, and said control circuit is provided in the subregion corresponding to said central region.

18. A semiconductor memory device, comprising:

a plurality of memory blocks provided to surround a central region in a rectangular semiconductor substrate region and each having a plurality of memory cells; and a control circuit provided in said central region for controlling accessing to said plurality of memory cells, said plurality of memory blocks being divided into a plurality of banks driven into an active state and an inactive state independently from each other under the control of said control circuit, said plurality of banks each including memory blocks provided adjacent to each other.

19. The semiconductor memory device as recited in claim 18, wherein said semiconductor substrate region is divided into subregions in a plurality of rows and columns, said plurality of memory blocks are provided one in each of the subregions excluding a subregion corresponding to said central region, and said control circuit is provided in the subregion corresponding to said central region.

* * * * *